United States Patent
Toyotaka et al.

(10) Patent No.: US 11,562,675 B2
(45) Date of Patent: Jan. 24, 2023

(54) FLIP-FLOP CIRCUIT, DRIVER CIRCUIT, DISPLAY PANEL, DISPLAY DEVICE, INPUT/OUTPUT DEVICE, AND DATA PROCESSING DEVICE

(71) Applicant: Semiconductor Energy Laboratory Co., Ltd., Atsugi (JP)

(72) Inventors: Kouhei Toyotaka, Atsugi (JP); Kazunori Watanabe, Machida (JP); Susumu Kawashima, Atsugi (JP); Daisuke Kubota, Atsugi (JP); Tetsuji Ishitani, Atsugi (JP); Akio Yamashita, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 31 days.

(21) Appl. No.: 17/269,736

(22) PCT Filed: Sep. 9, 2019

(86) PCT No.: PCT/IB2019/057561
§ 371 (c)(1),
(2) Date: Feb. 19, 2021

(87) PCT Pub. No.: WO2020/058799
PCT Pub. Date: Mar. 26, 2020

(65) Prior Publication Data
US 2021/0183294 A1    Jun. 17, 2021

(30) Foreign Application Priority Data

Sep. 21, 2018  (JP) .............................. JP2018-177156

(51) Int. Cl.
*G09G 3/20* (2006.01)
*G06F 3/041* (2006.01)

(52) U.S. Cl.
CPC .............. *G09G 3/20* (2013.01); *G06F 3/041* (2013.01); *G09G 2300/0426* (2013.01);
(Continued)

(58) Field of Classification Search
CPC ............. G09G 3/20; G09G 2300/0426; G09G 2300/08; G09G 2310/0267;
(Continued)

(56) References Cited

U.S. PATENT DOCUMENTS 7,687,808 B2    3/2010  Umezaki
7,978,274 B2    7/2011  Umezaki et al.
(Continued)

FOREIGN PATENT DOCUMENTS

CN    103718233 A    4/2014
CN    106663403 A    5/2017
(Continued)

OTHER PUBLICATIONS

International Search Report (Application No. PCT/IB2019/057561) dated Dec. 10, 2019.
(Continued)

*Primary Examiner* — Grant Sitta
(74) *Attorney, Agent, or Firm* — Robinson Intellectual Property Law Office; Eric J. Robinson

(57) ABSTRACT

A flip-flop circuit is provided. A driver circuit is provided. The flip-flop circuit includes first to fifth input terminals and first to third output terminals, the first input terminal is supplied with a first trigger signal, the second input terminal is supplied with a second trigger signal, the third input terminal is supplied with a batch selection signal, the fourth input terminal is supplied with a first pulse width modulation signal, and the fifth input terminal is supplied with a second pulse width modulation signal. The first output terminal supplies a first selection signal in response to the first pulse
(Continued)

width modulation signal in a period from supply of the first trigger signal to supply of the second trigger signal, the first output terminal supplies the first selection signal in a period during which the batch selection signal is supplied, the second output terminal supplies a second selection signal in response to the second pulse width modulation signal in the period from the supply of the first trigger signal to the supply of the second trigger signal, and the third output terminal supplies a third trigger signal.

9 Claims, 22 Drawing Sheets

(52) U.S. Cl.
CPC ............... *G09G 2300/08* (2013.01); *G09G 2310/0267* (2013.01); *G09G 2310/0286* (2013.01); *G09G 2320/0247* (2013.01)

(58) Field of Classification Search
CPC ... G09G 2310/0286; G09G 2320/0247; G09G 2310/08; G09G 3/3677; G09G 3/3266; G09G 2310/0235; G09G 2310/04; G09G 2354/00; G09G 3/3233; G09G 3/36; G09G 2300/0857; G06F 3/041; G02F 1/133; G11C 19/28
See application file for complete search history.

(56) References Cited

U.S. PATENT DOCUMENTS

| | | | |
|---|---|---|---|
| 8,054,279 B2 | 11/2011 | Umezaki et al. | |
| 8,223,112 B2* | 7/2012 | Ohkawa | G09G 3/3275 345/98 |
| 8,314,765 B2 | 11/2012 | Umezaki | |
| 8,836,686 B2 | 9/2014 | Umezaki et al. | |
| 9,076,394 B2* | 7/2015 | Saitoh | G06F 3/038 |
| 9,330,782 B2 | 5/2016 | Yamamoto et al. | |
| 9,412,291 B2 | 8/2016 | Toyotaka | |
| 9,886,905 B2 | 2/2018 | Toyotaka | |
| 10,014,068 B2* | 7/2018 | Sakakura | H01L 27/1225 |
| 10,074,313 B2 | 9/2018 | Nishikawa et al. | |
| 10,297,331 B2 | 5/2019 | Miyake | |
| 10,395,593 B2 | 8/2019 | Toyotaka | |
| 10,431,318 B2* | 10/2019 | Sakakura | H01L 27/1222 |
| 10,593,267 B2 | 3/2020 | Nishikawa et al. | |
| 2005/0079001 A1* | 4/2005 | Furukawa | B43K 7/03 401/190 |
| 2007/0274433 A1* | 11/2007 | Tobita | G11C 19/184 377/64 |
| 2009/0310734 A1* | 12/2009 | Umezaki | G11C 19/28 377/64 |
| 2011/0057190 A1* | 3/2011 | Kimura | H01L 27/1244 257/E27.06 |
| 2012/0287099 A1* | 11/2012 | Toyotaka | G09G 3/3233 345/79 |
| 2013/0088468 A1* | 4/2013 | Sakakura | H01L 27/1225 257/E27.06 |
| 2013/0100007 A1 | 4/2013 | Yamamoto et al. | |
| 2017/0125122 A1 | 5/2017 | Miyake | |
| 2017/0186373 A1 | 6/2017 | Nishikawa et al. | |
| 2019/0139507 A1* | 5/2019 | Li | G09G 3/3648 |
| 2019/0371241 A1 | 12/2019 | Toyotaka | |
| 2020/0098311 A1* | 3/2020 | Hsu | G06F 1/06 |
| 2020/0211668 A1* | 7/2020 | Cheng | G11C 19/28 |
| 2020/0258439 A1* | 8/2020 | Li | G09G 3/3266 |
| 2020/0273409 A1* | 8/2020 | Hsieh | G09G 3/3291 |

FOREIGN PATENT DOCUMENTS

| | | |
|---|---|---|
| JP | 2009-134814 A | 6/2009 |
| JP | 2011-209714 A | 10/2011 |
| JP | 2012-256031 A | 12/2012 |
| JP | 2017-084435 A | 5/2017 |
| KR | 2014-0045385 A | 4/2014 |
| KR | 2017-0016950 A | 2/2017 |
| WO | WO-2012/008186 | 1/2012 |
| WO | WO-2012/157186 | 11/2012 |
| WO | WO-2015/190407 | 12/2015 |

OTHER PUBLICATIONS

Written Opinion (Application No. PCT/IB2019/057561) dated Dec. 10, 2019.

* cited by examiner

FLIP-FLOP CIRCUIT, DRIVER CIRCUIT, DISPLAY PANEL, DISPLAY DEVICE, INPUT/OUTPUT DEVICE, AND DATA PROCESSING DEVICE

TECHNICAL FIELD

One embodiment of the present invention relates to a flip-flop circuit, a driver circuit, a display panel, a display device, an input/output device, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

A display device in which a shift of a selection signal in a shift register included in a scan line driver circuit and supply of a selection signal to scan lines are controlled independently of each other is known (Patent Document 1). The display device thus enables rewriting of only a given section of an image. In addition, the above-described operation is realized by providing a wiring for supplying a clock signal or a signal representing a fixed potential. Thus, in the display device including the wiring, the configuration of the circuit including the wiring can be simplified while partial driving can be performed.

REFERENCE

Patent Document

[Patent Document 1] Japanese Published Patent Application No. 2011-209714

SUMMARY OF THE INVENTION

Problems to be Solved by the Invention

One object of one embodiment of the present invention is to provide a novel flip-flop circuit that is highly convenient, useful, or reliable. Alternatively, one object is to provide a novel driver circuit that is highly convenient, useful, or reliable. Alternatively, one object is to provide a novel display panel that is highly convenient, useful, or reliable. Alternatively, one object is to provide a novel display device that is highly convenient, useful, or reliable. Alternatively, one object is to provide a novel input/output device that is highly convenient, useful, or reliable. Alternatively, one object is to provide a novel data processing device that is highly convenient, useful, or reliable. Alternatively, one object is to provide a novel flip-flop circuit, a novel driver circuit, a novel display panel, a novel display device, a novel input/output device, a novel data processing device, or a novel semiconductor device.

Note that the descriptions of these objects do not preclude the existence of other objects. One embodiment of the present invention does not have to achieve all these objects. Objects other than these will be apparent from the descriptions of the specification, the drawings, the claims, and the like, and objects other than these can be derived from the descriptions of the specification, the drawings, the claims, and the like.

Means for Solving the Problems (1) One embodiment of the present invention is a flip-flop circuit SR(i) including a first input terminal LIN(i), a second input terminal RIN(i), a third input terminal E(i), a fourth input terminal A(i), a fifth input terminal B(i), a first output terminal G1($i$), a second output terminal G2($i$), and a third output terminal OUT(i).

The first input terminal LIN(i) is supplied with a first trigger signal, the second input terminal RIN(i) is supplied with a second trigger signal, the third input terminal E(i) is supplied with a batch selection signal, the fourth input terminal A(i) is supplied with a first pulse width modulation signal, and the fifth input terminal B(i) is supplied with a second pulse width modulation signal.

The first output terminal G1($i$) has a function of supplying a first selection signal in response to the first pulse width modulation signal in a period from supply of the first trigger signal to supply of the second trigger signal, and the first output terminal G1($i$) has a function of supplying the first selection signal in a period during which the batch selection signal is supplied.

The second output terminal G2($i$) supplies a second selection signal in response to the second pulse width modulation signal in the period from the supply of the first trigger signal to the supply of the second trigger signal.

The third output terminal OUT(i) supplies a third trigger signal.

(2) One embodiment of the present invention is the above flip-flop circuit SR(i) including a first transistor M13, a second transistor M23, a third transistor M7, a node GN1($i$), and a first wiring GVSS.

The first transistor M13 includes a gate electrode electrically connected to the node GN1($i$), a first electrode electrically connected to the first output terminal G1($i$), and a second electrode electrically connected to the third input terminal E(i). The first transistor M13 is in a non-conducting state in the period from the supply of the first trigger signal to the supply of the second trigger signal.

The second transistor M23 includes a gate electrode electrically connected to the node GN1($i$), a first electrode electrically connected to the second output terminal G2($i$), and a second electrode electrically connected to the first wiring GVSS. The second transistor M23 is in a non-conducting state in the period from the supply of the first trigger signal to the supply of the second trigger signal.

The third transistor M7 includes a gate electrode electrically connected to the node GN1($i$), a first electrode electrically connected to the third output terminal OUT(i), and a second electrode electrically connected to the first wiring GVSS. The third transistor M7 is in a non-conducting state in the period from the supply of the first trigger signal to the supply of the second trigger signal.

Accordingly, the first selection signal and the second selection signal can be supplied in the period from the supply of the first trigger signal to the supply of the second trigger signal. Alternatively, the first selection signal can be supplied in the period during which the batch selection signal is supplied. As a result, a novel flip-flop circuit that is highly convenient, useful, or reliable can be provided.

(3) One embodiment of the present invention is the above flip-flop circuit SR(i) including a fourth transistor M24 and a second wiring GVDD.

The fourth transistor M24 includes a gate electrode electrically connected to the second wiring GVDD, a first electrode electrically connected to the node GN1(*i*), and a second electrode electrically connected to the gate electrode of the first transistor M13.

Accordingly, the fourth transistor M24 can be in a non-conducting state in a period TB during which the batch selection signal is high, which is not the period from the supply of the first trigger signal to the supply of the second trigger signal. Alternatively, a potential of the node GN1(*i*) can be made lower than a potential obtained by subtracting a threshold voltage of the transistor M24 from a potential supplied from the GVDD. Alternatively, stress which is due to potential increase of the node GN1(*i*) and is applied to the first transistor M13, the second transistor M23, the third transistor M7, a transistor M5, and a transistor M18 can be suppressed. Alternatively, stress which is due to potential increase of the node GN1(*i*) and is applied to a transistor M15 and a transistor M19 can be suppressed. As a result, a novel flip-flop circuit that is highly convenient, useful, or reliable can be provided.

(4) One embodiment of the present invention is a driver circuit GD including a group of flip-flop circuits SR(1) to SR(m+2) and a third wiring VEE.

The group of flip-flop circuits SR(1) to SR(m+2) includes the above first flip-flop circuit SR(i), a second flip-flop circuit SR(i+1), and a third flip-flop circuit SR(i+2).

The second flip-flop circuit SR(i+1) is electrically connected to the first flip-flop circuit SR(i), the second flip-flop circuit SR(i+1) is electrically connected to the third flip-flop circuit SR(i+2), and the second flip-flop circuit SR(i+1) is supplied with the third trigger signal.

The third flip-flop circuit SR(i+2) supplies the second trigger signal.

The third wiring VEE supplies the batch selection signal. The third wiring VEE is electrically connected to the group of flip-flop circuits SR(1) to SR(m+2).

Accordingly, the group of flip-flop circuits can supply the first selection signals in a predetermined order. Alternatively, the group of flip-flop circuits can supply the second selection signals in a predetermined order. Alternatively, the group of flip-flop circuits can supply the first selection signals simultaneously. As a result, a novel driver circuit that is highly convenient, useful, or reliable can be provided.

(5) One embodiment of the present invention is a display panel including a display region 231 and the above driver circuit GD.

The display region 231 includes a first scan line GL1(*i*), a second scan line GL2(*i*), a first signal line SL1(*j*), a second signal line SL2(*j*), and a pixel 702(*i, j*).

The pixel 702(*i, j*) includes a display element 750(*i, j*) and a pixel circuit 530(*i, j*).

The display element 750(*i, j*) is electrically connected to the pixel circuit 530(*i, j*).

The pixel circuit 530(*i, j*) is electrically connected to the first scan line GL1(*i*), the second scan line GL2(*i*), the first signal line SL1(*j*), and the second signal line SL2(*j*).

The first scan line GL1(*i*) is electrically connected to the first output terminal G1(*i*), and the second scan line GL2(*i*) is electrically connected to the second output terminal G2(*i*).

Accordingly, the first selection signal can be supplied to the first scan line GL1(*i*). Alternatively, the second selection signal can be supplied to the second scan line GL2(*i*). Alternatively, the pixel 702(*i, j*) can be driven using the first selection signal or the second selection signal. As a result, a novel display panel that is highly convenient, useful, or reliable can be provided.

(6) One embodiment of the present invention is the above display panel in which the display region 231 includes a group of pixels 702(*i*, 1) to 702(*i, n*) and a different group of pixels 702(1, *j*) to 702(*m, j*).

The group of pixels 702(*i*, 1) to 702(*i, n*) is arranged in a row direction, and the group of pixels 702(*i*, 1) to 702(*i, n*) includes the pixel 702(*i, j*).

The different group of pixels 702(1, *j*) to 702(*m, j*) is arranged in a column direction intersecting the row direction, and the different group of pixels 702(1, *j*) to 702(*m, j*) includes the pixel 702(*i, j*).

The first scan line GL1(*i*) is electrically connected to the group of pixels 702(*i*, 1) to 702(*i*, n), and the second scan line GL2(*i*) is electrically connected to the group of pixels 702(*i*, 1) to the pixel 702(*i, n*).

The first signal line SL1(*j*) is electrically connected to the different group of pixels 702(1, *j*) to 702(*m, j*), and the second signal line SL2(*j*) is electrically connected to the different group of pixels 702(1, *j*) to 702(*m, j*).

Accordingly, image data can be supplied to a plurality of pixels. As a result, a novel display panel that is highly convenient, useful, or reliable can be provided.

(7) One embodiment of the present invention is the above display panel including a functional layer 520. The functional layer 520 includes the driver circuit GD and the pixel circuit 530(*i, j*).

Accordingly, a semiconductor film used for a transistor of the driver circuit GD can be formed in a step of forming a semiconductor film used for a transistor of the pixel circuit 530(*i, j*). Alternatively, the number of components can be reduced. As a result, a novel display panel that is highly convenient, useful, or reliable can be provided.

(8) One embodiment of the present invention is a display device including the above display panel 700 and a control portion 238.

The control portion 238 is supplied with image data VI and control data CI, the control portion 238 generates data V11 on the basis of the image data VI, and the control portion 238 generates a control signal SP on the basis of the control data CI. Furthermore, the control portion 238 supplies the data V11 and the control signal SP.

The display panel 700 is supplied with the data V11 and the control signal SP, and the pixel 702(*i, j*) displays the image data on the basis of the data V11.

Accordingly, the image data can be displayed using a display element. As a result, a novel display device that is highly convenient, useful, or reliable can be provided.

(9) One embodiment of the present invention is an input/output device including an input portion 240 and a display portion 230.

The display portion 230 includes the above display panel 700.

The input portion 240 includes a sensing region 241, and the input portion 240 senses an object approaching the sensing region 241.

The sensing region 241 has a region overlapping with the pixel 702(*i, j*).

Accordingly, an object approaching a region overlapping with the display portion can be sensed while image data is displayed using the display portion. Alternatively, a finger or the like that approaches the display portion can be used as a pointer to input positional data. Alternatively, positional data can be associated with image data displayed on the display portion. As a result, a novel input/output device that is highly convenient, useful, or reliable can be provided.

(10) One embodiment of the present invention is a data processing device including an arithmetic unit 210 and an input/output device 220.

The arithmetic unit 210 is supplied with input data II or sensing data DS, and the arithmetic unit 210 generates the control data CI and the image data VI on the basis of the input data II or the sensing data DS. Furthermore, the arithmetic unit 210 supplies the control data CI and the image data VI.

The input/output device 220 supplies the input data II and the sensing data DS, the input/output device 220 is supplied with the control data CI and the image data VI, and the input/output device 220 includes the display portion 230, the input portion 240, and a sensing portion 250.

The display portion 230 includes the above display panel 700, and the display portion 230 displays the image data VI on the basis of the control data CI.

The input portion 240 generates the input data II, and the sensing portion 250 generates the sensing data DS.

Accordingly, the control data CI can be generated on the basis of the input data II or the sensing data DS. Alternatively, the image data VI can be displayed on the basis of the input data II or the sensing data DS. As a result, a novel data processing device that is highly convenient, useful, or reliable can be provided.

(11) One embodiment of the present invention is a data processing device including one or more of a keyboard, a hardware button, a pointing device, a touch sensor, an illuminance sensor, an imaging device, an audio input device, an eye-gaze input device, and an attitude detection device, and the above display panel.

Accordingly, an arithmetic unit can generate image data or control data on the basis of data supplied using a variety of input devices. As a result, a novel data processing device that is highly convenient, useful, or reliable can be provided.

Although the block diagram in which components are classified by their functions and shown as independent blocks is shown in the drawings attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above semiconductor film. Similarly, a drain of a transistor means a drain region that is part of the above semiconductor film or a drain electrode connected to the above semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel flip-flop circuit that is highly convenient, useful, or reliable can be provided. Alternatively, a novel driver circuit that is highly convenient, useful, or reliable can be provided. Alternatively, a novel display panel that is highly convenient, useful, or reliable can be provided. Alternatively, a novel display device that is highly convenient, useful, or reliable can be provided. Alternatively, a novel input/output device that is highly convenient, useful, or reliable can be provided. Alternatively, a novel data processing device that is highly convenient, useful, or reliable can be provided. Alternatively, a novel flip-flop circuit, a novel driver circuit, a novel display panel, a novel display device, a novel input/output device, a novel data processing device, or a novel semiconductor device can be provided.

Note that the descriptions of these effects do not preclude the existence of other effects. Note that one embodiment of the present invention does not need to have all these effects. Effects other than these will be apparent from the descriptions of the specification, the drawings, the claims, and the like, and effects other than these can be derived from the descriptions of the specification, the drawings, the claims, and the like.

MODE FOR CARRYING OUT THE INVENTION

Figure 1A:
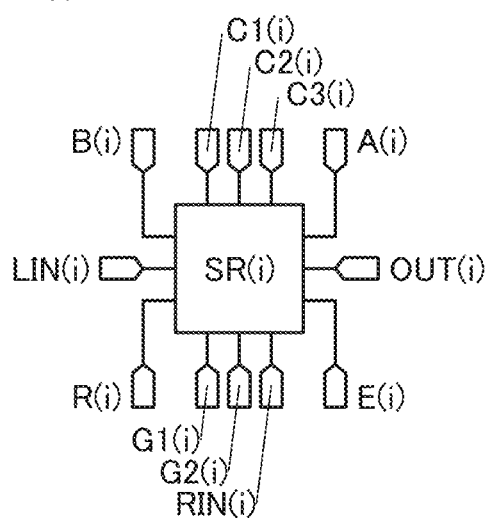
FIG. 1A to FIG. 1C are block diagrams each illustrating a configuration of a flip-flop circuit of one embodiment.

A flip-flop circuit of one embodiment of the present invention includes first to fifth input terminals and first to third output terminals. The first input terminal is supplied with a first trigger signal, the second input terminal is supplied with a second trigger signal, the third input terminal is supplied with a batch selection signal, the fourth input terminal is supplied with a first pulse width modulation signal, and the fifth input terminal is supplied with a second pulse width modulation signal. Furthermore, the first output terminal supplies a first selection signal in response to the first pulse width modulation signal in a period from supply of the first trigger signal to supply of the second trigger signal, the first output terminal supplies the first selection signal in a period during which the batch selection signal is supplied, the second output terminal supplies a second selection signal in response to the second pulse width modulation signal in the period from the supply of the first trigger signal to the supply of the second trigger signal, and the third output terminal supplies a third trigger signal.

Accordingly, the first selection signal and the second selection signal can be supplied in the period from the supply of the first trigger signal to the supply of the second trigger signal. Alternatively, the first selection signal can be supplied in the period during which the batch selection signal is supplied. As a result, a novel flip-flop circuit that is highly convenient, useful, or reliable can be provided.

Embodiments are described in detail with reference to the drawings. Note that the present invention is not limited to the following descriptions, and it will be readily appreciated by those skilled in the art that modes and details of the present invention can be modified in various ways without departing from the spirit and scope of the present invention. Thus, the present invention should not be construed as being limited to the descriptions in the following embodiments. Note that in structures of the present invention described below, the same portions or portions having similar functions are denoted by the same reference numerals in different drawings, and a description thereof is not repeated.

Embodiment 1

In this embodiment, configurations of a flip-flop circuit of one embodiment of the present invention will be described with reference to FIG. 1 to FIG. 5.

Figure 1B:
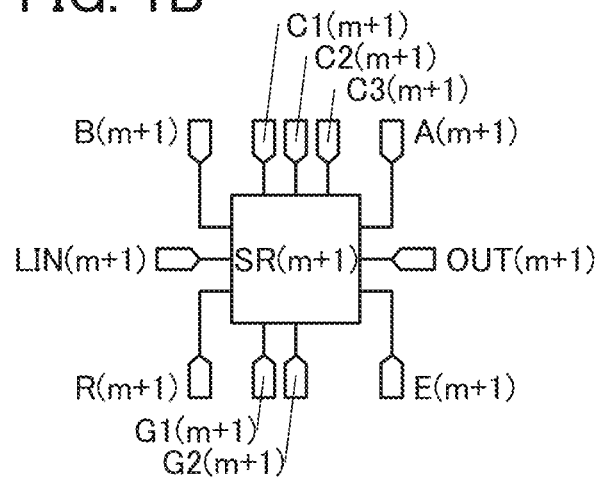
Figure 1C:
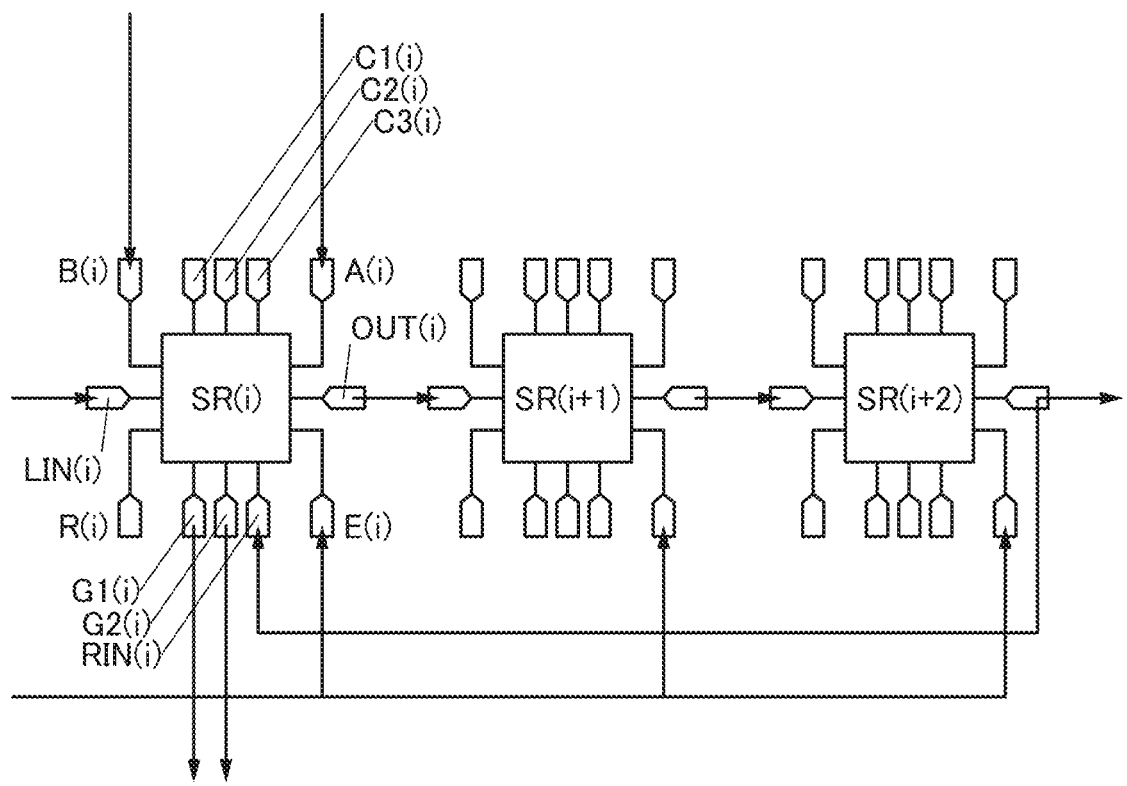

FIG. 1 shows block diagrams each illustrating a configuration of the flip-flop circuit of one embodiment of the present invention. FIG. 1A and FIG. 1B are block diagrams each illustrating a configuration of terminals included in the flip-flop circuit of one embodiment of the present invention, and FIG. 1C is a block diagram illustrating a connection example of a plurality of flip-flop circuits of one embodiment of the present invention.

Figure 2A:
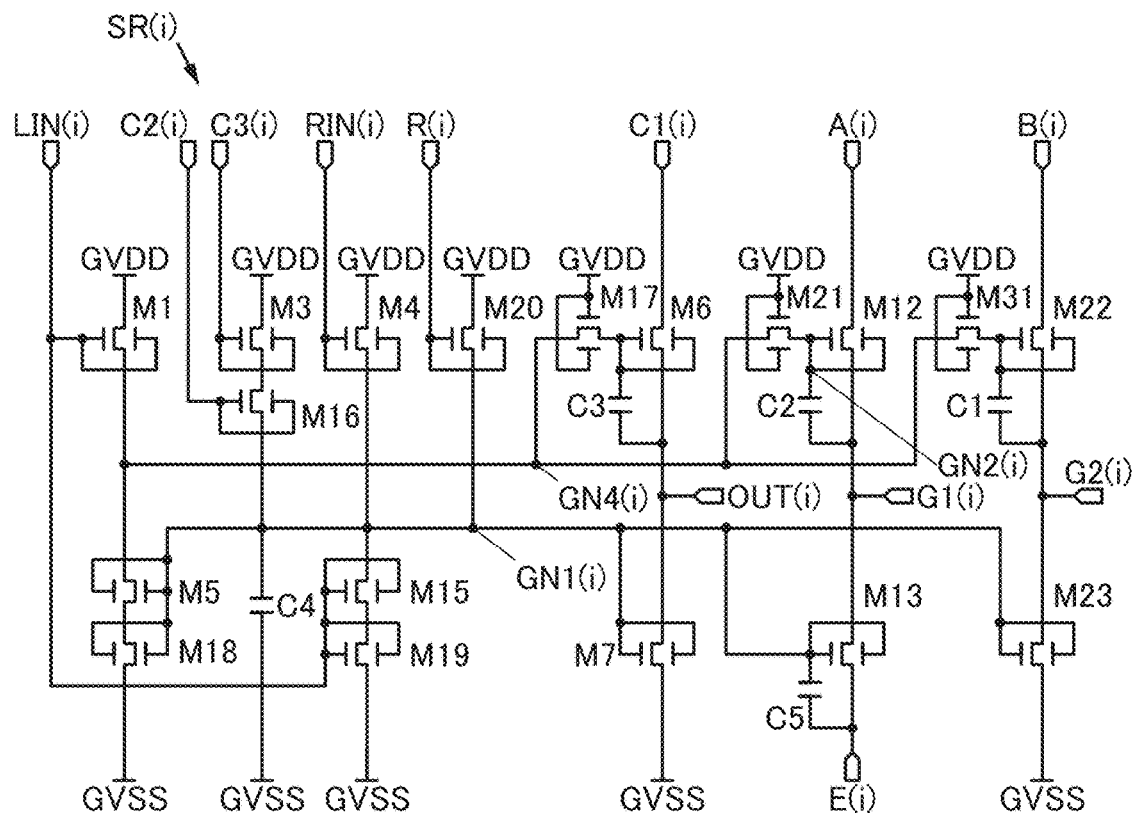
FIG. 2A and FIG. 2B are circuit diagrams each illustrating a configuration of a flip-flop circuit of one embodiment.
Figure 2B:
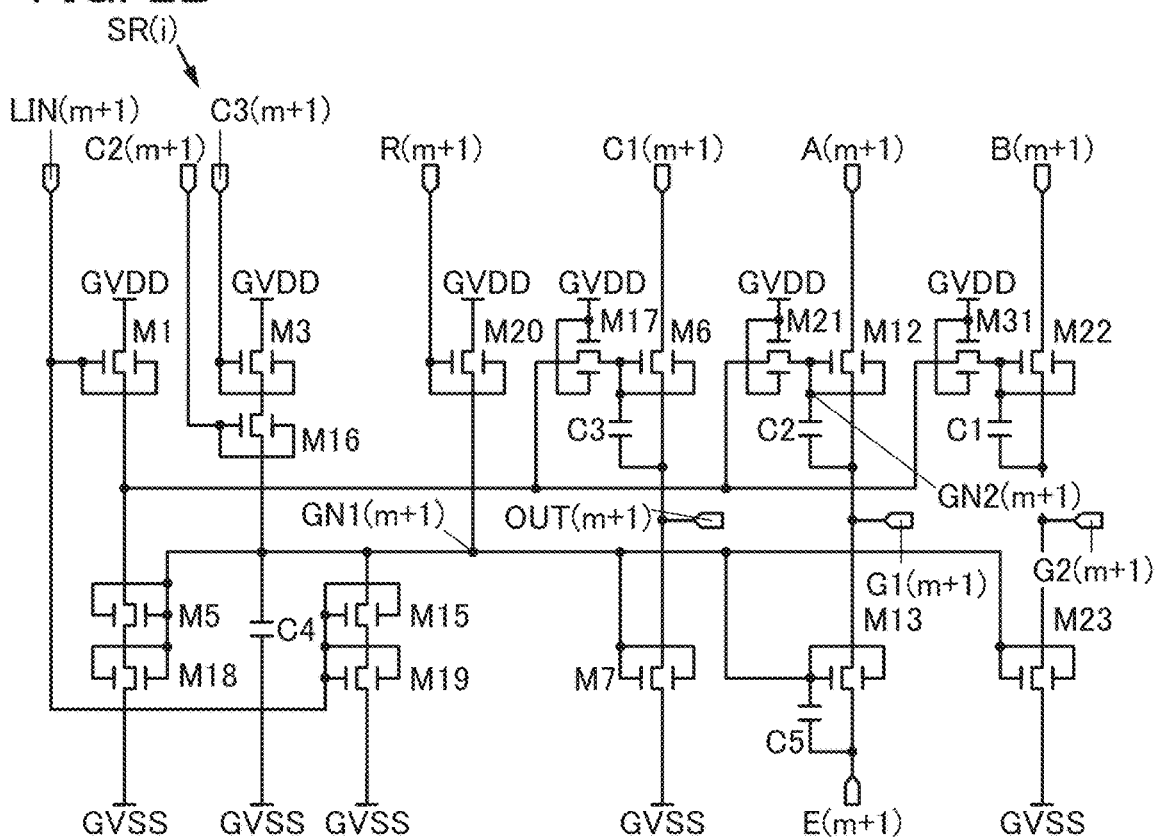

FIG. 2 shows diagrams each illustrating a configuration of the flip-flop circuit of one embodiment of the present invention. FIG. 2A is a circuit diagram of the flip-flop circuit of one embodiment of the present invention, and FIG. 2B is a circuit diagram of a flip-flop circuit that can be used by being connected to the flip-flop circuit in FIG. 2A.

Figure 3A:
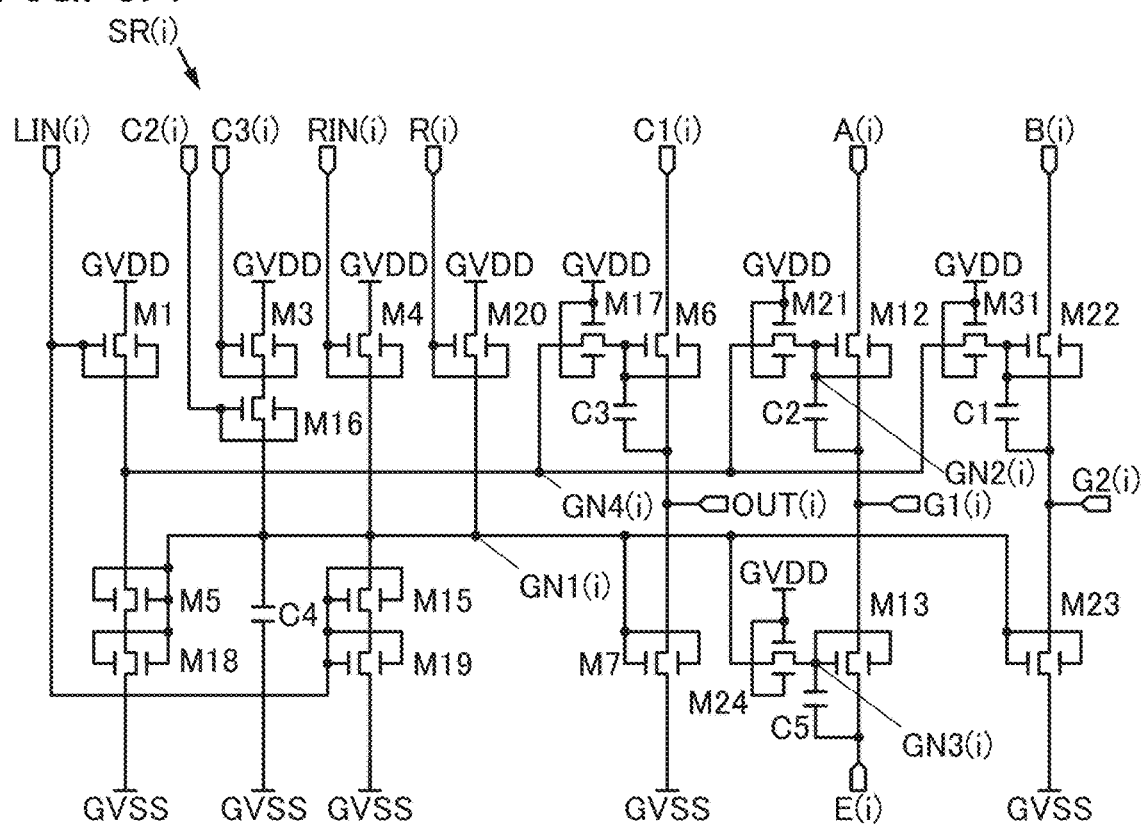
FIG. 3A and FIG. 3B are circuit diagrams each illustrating a configuration of a flip-flop circuit of one embodiment.
Figure 3B:
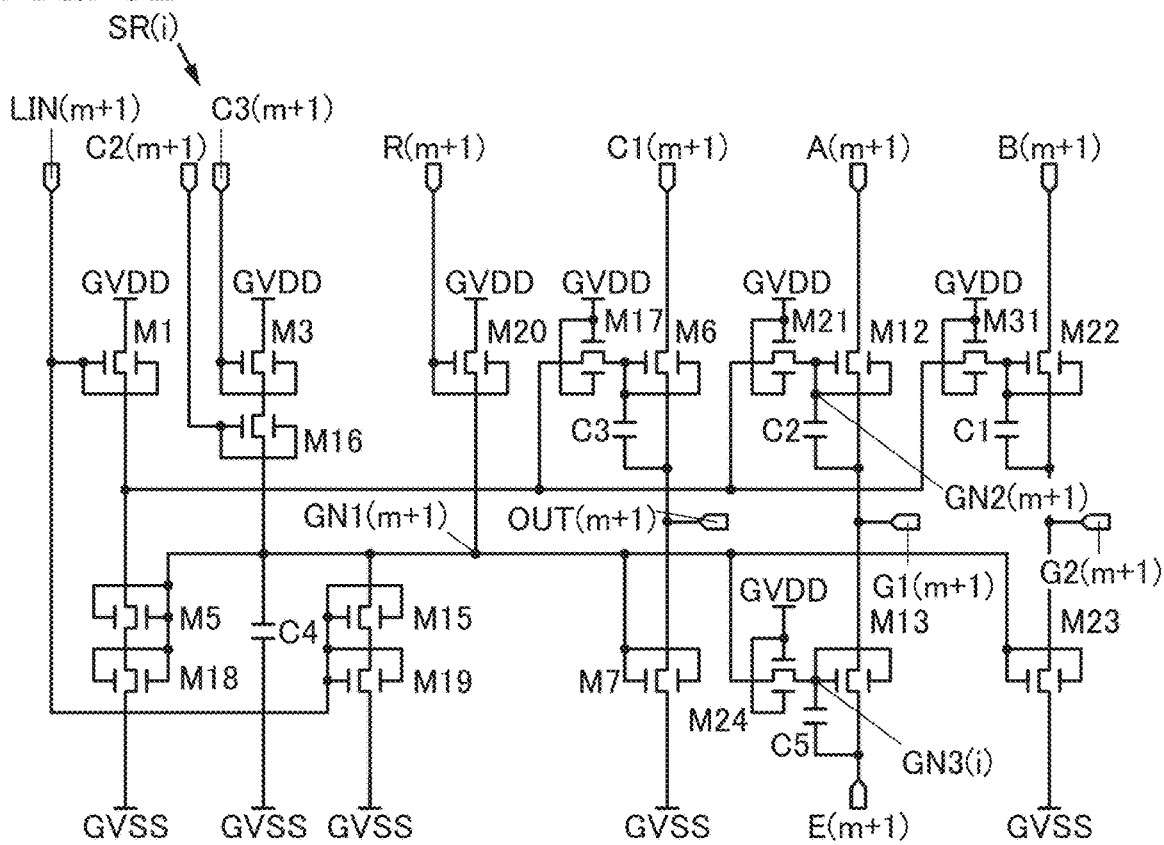

FIG. 3 shows diagrams each illustrating a configuration of the flip-flop circuit of one embodiment of the present invention. FIG. 3A is a circuit diagram of the flip-flop circuit of one embodiment of the present invention, and FIG. 3B is a circuit diagram of a flip-flop circuit that can be used by being connected to the flip-flop circuit in FIG. 3A.

Figure 4A:
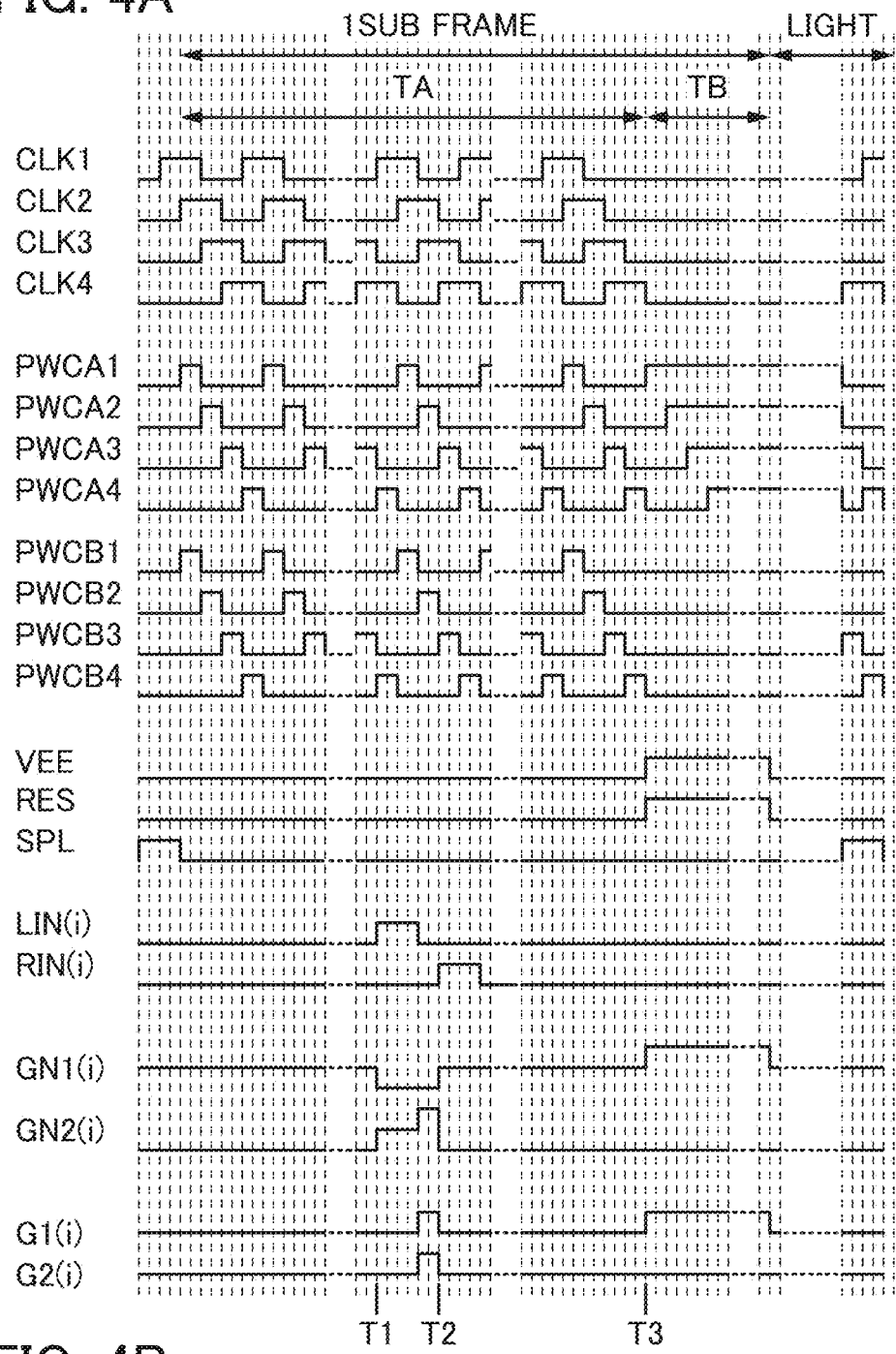
FIG. 4A and FIG. 4B are timing charts each showing an operation of a driver circuit including a flip-flop circuit of one embodiment.
Figure 4B:
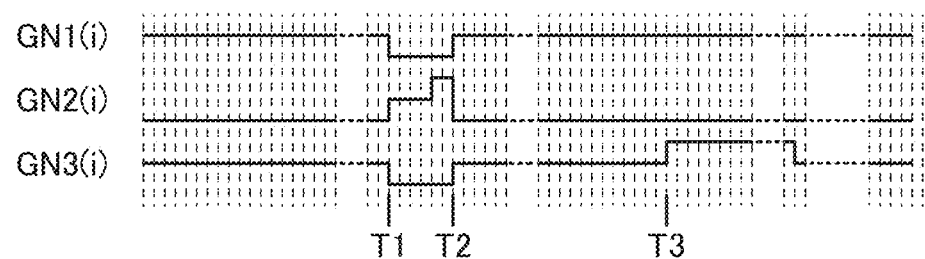

FIG. 4 shows diagrams each showing an operation of the flip-flop circuit of one embodiment of the present invention. FIG. 4A is a timing chart showing an operation of a driver circuit including the flip-flop circuit of one embodiment of the present invention illustrated in FIG. 2, and FIG. 4B is a timing chart showing an operation of a driver circuit including the flip-flop circuit of one embodiment of the present invention illustrated in FIG. 3.

Figure 5A:
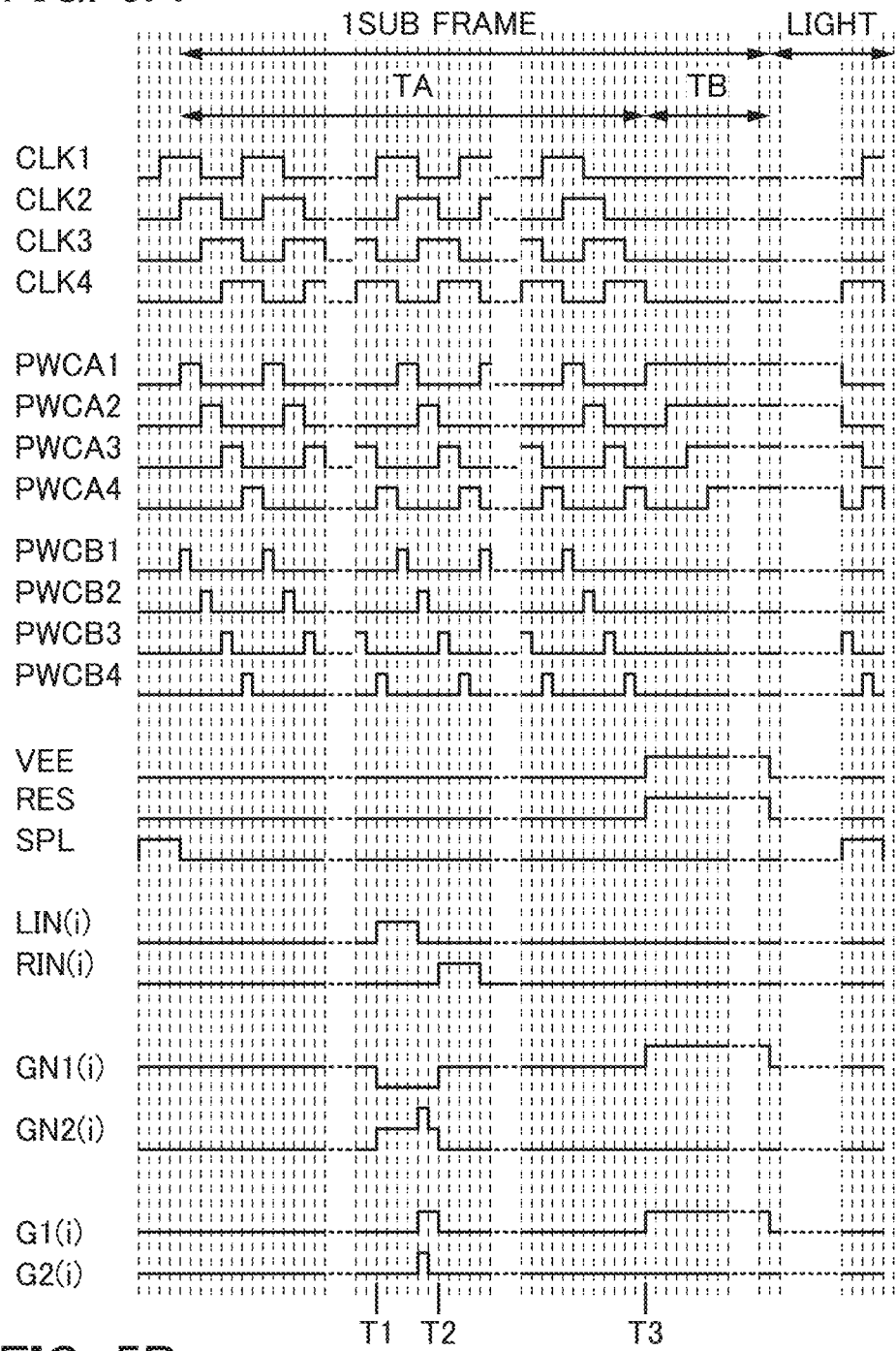
FIG. 5A and FIG. 5B are timing charts each illustrating an operation of a driver circuit including a flip-flop circuit of one embodiment.
Figure 5B:
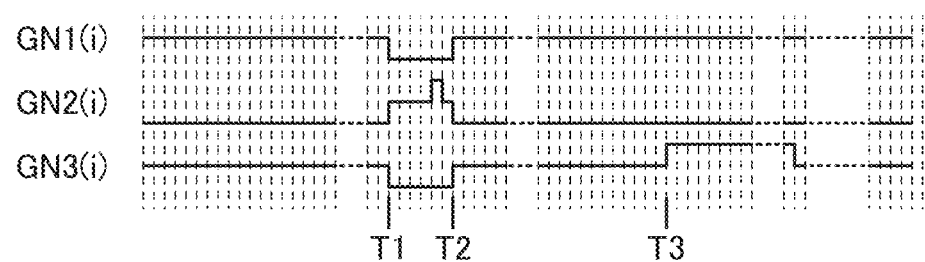

FIG. 5 shows diagrams each showing an operation of the flip-flop circuit of one embodiment of the present invention. FIG. 5A is a timing chart showing an operation of the driver circuit including the flip-flop circuit of one embodiment of the present invention illustrated in FIG. 2, which is different from that in FIG. 4A, and FIG. 5B is a timing chart showing an operation of the driver circuit including the flip-flop circuit of one embodiment of the present invention illustrated in FIG. 3, which is different from that in FIG. 4B.

Note that in this specification, an integer variable of 1 or more is sometimes used in reference numerals. For example, (p) where p is an integer variable of 1 or more is sometimes used as part of a reference numeral that specifies any of p components at a maximum. For another example, (m, n) where m and n are each an integer variable of 1 or more is sometimes used as part of a reference numeral that specifies any of m×n components at a maximum.

Configuration Example 1 of Flip-Flop Circuit

A flip-flop circuit SR(i) described in this embodiment includes an input terminal LIN(i), an input terminal RIN(i), an input terminal E(i), an input terminal A(i), and an input terminal B(i). Furthermore, an output terminal G1(i), an output terminal G2(i), and an output terminal OUT(i) are included (see FIG. 1A). Furthermore, a terminal C1(i), a terminal C2(i), and a terminal C3(i) are included. Note that one of the terminal C1(i) to the terminal C3(i) is electrically connected to one selected from a wiring CLK1 to a wiring CLK4. For example, the terminal C1(i) is electrically connected to the wiring CLK1, the terminal C2(i) is electrically connected to the wiring CLK2, and the terminal C3(i) is electrically connected to the wiring CLK3. Accordingly, a plurality of clock signals whose phases shift can be supplied to the terminal C1(i) to the terminal C3(i).

<<Input Terminal>>

The input terminal LIN(i) is supplied with a first trigger signal, and the input terminal RIN(i) is supplied with a second trigger signal (see FIG. 4A).

The input terminal E(i) is supplied with a batch selection signal.

The input terminal A(i) is supplied with a first pulse width modulation signal and the input terminal B(i) is supplied with a second pulse width modulation signal.

<<Output Terminal>>

The output terminal G1 (i) supplies a first selection signal in response to the first pulse width modulation signal in a period from supply of the first trigger signal to supply of the second trigger signal. The output terminal G1(i) supplies the first selection signal in a period during which the batch selection signal is supplied (see FIG. 4A and FIG. 5A).

The output terminal G2(i) supplies a second selection signal in response to the second pulse width modulation signal in the period from the supply of the first trigger signal to the supply of the second trigger signal.

The output terminal OUT(i) supplies a third trigger signal.

Configuration Example 2 of Flip-Flop Circuit

A transistor M1, a transistor M16, a transistor M3, a transistor M4, a transistor M6, a transistor M12, a transistor M22, a transistor M5, a transistor M15, a transistor M7, a transistor M13, and a transistor M23 can be used in the flip-flop circuit SR(i), for example (see FIG. 2A). Furthermore, a transistor M17, a transistor M21, a transistor M31, a transistor M18, and a transistor M19 can be used in the flip-flop circuit SR(i). Furthermore, a capacitor C1, a capacitor C2, a capacitor C3, a capacitor C4, and a capacitor C5 can be used.

Note that the flip-flop circuit of one embodiment of the present invention can be configured with transistors having the same polarity type. Specifically, transistors that exhibit an n-type operation can be used.

<<Transistor M1, Transistor M15, and Transistor M19>>

The transistor M1, the transistor M15, and the transistor M19 each include a gate electrode to which the first trigger signal is supplied. Note that the transistor M1 has a function of supplying the potential of a wiring GVDD to a node GN4(i) in response to the first trigger signal.

The transistor M15 and the transistor M19 have a function of supplying the potential of a wiring GVSS to the node GN1(i) in response to the first trigger signal. Accordingly, an operation of the flip-flop circuit SR(i) can be started. Alternatively, the node GN1(i) can keep being in a floating state until the potential of the wiring GVSS is supplied to the node GN1(i).

<<Transistor M4>>

The transistor M4 includes a gate electrode to which the second trigger signal is supplied. Note that the transistor M4 has a function of supplying the potential of the wiring GVDD to the node GN1(i) in response to the second trigger signal.

<<Transistor M6, Transistor M12, and Transistor M22>>

The transistor M6, the transistor M12, and the transistor M22 each include a gate electrode electrically connected to the node GN4(i). Note that the transistor M6 has a function of supplying a first clock signal to the output terminal OUT(i), the transistor M12 has a function of supplying the first pulse width modulation signal to the output terminal G1(i), and the transistor M22 has a function of supplying the second pulse width modulation signal to the output terminal G2(i), depending on the potential of the node GN4(i).

<<Transistor M5, Transistor M18, Transistor M7, Transistor M13, and Transistor M23>>

The transistor M5, the transistor M18, the transistor M7, the transistor M13, and the transistor M23 each include a gate electrode electrically connected to the node GN1(i). Note that the transistor M5 and the transistor M18 have a function of supplying the potential of the wiring GVSS to the node GN4(i), the transistor M7 has a function of supplying the potential of the wiring GVSS to the output terminal OUT(i), the transistor M13 has a function of supplying the potential of the input terminal E(i) to the output terminal G1(i), and the transistor M23 has a function of supplying the potential of the wiring GVSS to the output terminal G2(i), depending on the potential of the node GN1(i).

<<Transistor M16 and Transistor M3>>

The transistor M16 includes a gate electrode to which a second clock signal is supplied, and the transistor M3 includes a gate electrode to which a third clock signal is supplied. Note that the transistor M16 and the transistor M3 have a function of supplying the potential of the wiring GVDD to the node GN1(i) in a period during which the second clock signal and the third clock signal overlap with each other.

<<Transistor M20>>

A transistor M20 includes a gate electrode electrically connected to a terminal R(i). Note that the transistor M20 supplies the potential of the wiring GVDD to the node GN1(i) depending on the potential of the terminal R(i). For example, a reset signal can be supplied to the terminal R(i). As a result, the flip-flop circuit SR(i) can be reset. Alternatively, a shift register circuit including the flip-flop circuit SR(i) can be reset. Note that the flip-flop circuit SR(i) can also be reset using a clock signal.

<<Transistor M17, Transistor M21, and Transistor M31>>

The transistor M17, the transistor M21, and the transistor M31 each include a gate electrode to which the potential of the wiring GVDD is supplied. Accordingly, stress applied to the transistor M6, the transistor M12, and the transistor M22 in the case where the potential of the node GN4(i) becomes higher than the potential of the wiring GVDD can be suppressed, for example. Alternatively, output can be stably supplied by using the node GN4(i). Alternatively, stress applied between a first electrode and a second electrode of each of the transistor M1, the transistor M5, and the transistor M18 can be suppressed.

A flip-flop circuit SR(m+1) has a configuration similar to that of the flip-flop circuit SR(i) except that the input terminal RIN(i) and the transistor M4 are not provided (see FIG. 1B and FIG. 2B). The flip-flop circuit SR(m+1) can be used in the last stage of a shift register circuit. Note that a transistor in which a region where a channel is formed is wider than that in a transistor used in the flip-flop circuit SR(i) is suitable for the flip-flop circuit SR(m+1). Specifically, the width of a region where a channel is formed in the transistor M3 or the transistor M16 included in the flip-flop circuit SR(m+1) is wider than the width of a region where a channel is formed in the transistor M3 or the transistor M16 included in the flip-flop circuit SR(i).

Configuration Example 3 of Flip-Flop Circuit

The flip-flop circuit SR(i) described in this embodiment includes the transistor M13, the transistor M23, the transistor M7, the node GN1(i), and the wiring GVSS (see FIG. 2A, FIG. 2B, FIG. 3A, and FIG. 3B).

<<Transistor M13>>

The transistor M13 includes the gate electrode electrically connected to the node GN1(i), a first electrode electrically connected to the output terminal G1(i), and a second electrode electrically connected to the input terminal E(i).

The transistor M13 is in a non-conducting state in the period from the supply of the first trigger signal to the supply of the second trigger signal.

<<Transistor M23>>

The transistor M23 includes the gate electrode electrically connected to the node GN1(i), a first electrode electrically connected to the output terminal G2(i), and a second electrode electrically connected to the wiring GVSS.

The transistor M23 is in a non-conducting state in the period from the supply of the first trigger signal to the supply of the second trigger signal.

<<Transistor M7>>

The transistor M7 includes the gate electrode electrically connected to the node GN1(i), a first electrode electrically connected to the output terminal OUT(i), and a second electrode electrically connected to the wiring GVSS.

The transistor M7 is in a non-conducting state in the period from the supply of the first trigger signal to the supply of the second trigger signal.

Accordingly, the first selection signal and the second selection signal can be supplied in the period from the supply of the first trigger signal to the supply of the second trigger signal. Alternatively, the first selection signal can be supplied in the period during which the batch selection signal is supplied. As a result, a novel flip-flop circuit that is highly convenient, useful, or reliable can be provided.

Configuration Example 4 of Flip-Flop Circuit

The flip-flop circuit SR(i) described in this embodiment includes a transistor M24 and the wiring GVDD (see FIG. 3A and FIG. 3B).

The transistor M24 includes a gate electrode electrically connected to the wiring GVDD, a first electrode electrically connected to the node GN1(i), and a second electrode electrically connected to the gate electrode of the transistor M13.

Accordingly, the transistor M24 can be in a non-conducting state in a period TB during which the batch selection signal is high, which is not the period from the supply of the first trigger signal to the supply of the second trigger signal (see FIG. 3B or FIG. 4B). Alternatively, the potential of the node GN1(i) can be made lower than a potential obtained by subtracting the threshold voltage of the transistor M24 from a potential supplied from the wiring GVDD. Alternatively, stress which is due to potential increase of the node GN1(i) and is applied to the transistor M23, the transistor M7, the transistor M5, and the transistor M18 can be suppressed. Alternatively, stress which is due to potential increase of the node GN1(i) and is applied to the transistor M15 and the transistor M19 can be suppressed. As a result, a novel flip-flop circuit that is highly convenient, useful, or reliable can be provided.

<<Potential of Node GN2(i)>>

The potential of the wiring GVDD is supplied to a node GN2(i) in a period during which the first trigger signal is high (see FIG. 2A, FIG. 2B, and T1 in FIG. 4A). Furthermore, the node GN2(i) keeps being in a floating state in a period during which the first trigger signal and the second trigger signal are low and during which the potential of the node GN1(i) is lower than a value obtained by adding the threshold voltage of the transistor M5 to the potential supplied from the wiring GVDD or the potential of the node GN1(i) is lower than a value obtained by adding the threshold voltage of the transistor M18 to the potential supplied from the wiring GVDD (see T2 in FIG. 4A).

Note that the node GN2(i) is capacitively coupled to the output terminal G1(i) via the capacitor C2, for example.

<<Potential of node GN1(i)>>

The potential of the wiring GVSS is supplied to the node GN1(i) in the period during which the first trigger signal is high (see FIG. 2A, FIG. 2B, and T1 in FIG. 4A). Furthermore, the node GN1(i) keeps being in a floating state in a period during which the first trigger signal and the second trigger signal are low (see T2 in FIG. 4A).

Note that the node GN1(i) is capacitively coupled to the input terminal E(i) via the capacitor C5, for example.

In the case where the flip-flop circuit SR(i) does not include the transistor M24, for example, the potential of the node GN1(i) is affected by the potential of the input terminal E(i). Alternatively, the potential of the node GN1(i) increases under the influence of the batch selection signal, for example (see FIG. 2A, FIG. 2B, and T3 in FIG. 4A). Alternatively, the potential of the node GN1(i) becomes close to a potential obtained by adding voltage supplied by the batch selection signal to the potential supplied from the wiring GVDD, for example.

Meanwhile, in the case where the flip-flop circuit SR(i) includes the transistor M24, the potential of a node GN3(i) is affected by the potential of the input terminal E(i). Alternatively, the potential of the node GN3(i) increases under the influence of the batch selection signal, for example (see FIG. 3A, FIG. 3B, and T3 in FIG. 4B). Alternatively, the potential of the node GN3(i) becomes close to a potential obtained by adding voltage with which the batch selection signal becomes high to the potential supplied from the wiring GVDD, for example. Alternatively, the transistor M24 is brought into a non-conducting state. Alternatively, the influence of the batch selection signal on the potential of the node GN1(i) can be inhibited. Alternatively, the potential of the node GN1(i) can be made lower than a potential obtained by subtracting the threshold voltage of the transistor M24 from the voltage supplied from the wiring GVDD. Alternatively, the influence of the batch selection signal on the potential of the node GN1(i) can be eliminated. Alternatively, stress applied to a transistor including a gate electrode electrically connected to the node GN1(i) can be suppressed. Alternatively, stress applied to the transistor M13, the transistor M23, the transistor M7, the transistor M5, and the transistor M18 can be suppressed. Alternatively, stress applied to the transistor M15 and the transistor M19 can be suppressed. Alternatively, stress applied to the transistor M16, the transistor M4, and the transistor M20 can be suppressed. As a result, a novel flip-flop circuit that is highly convenient, useful, or reliable can be provided.

Note that this embodiment can be combined with other embodiments described in this specification as appropriate.

Embodiment 2

In this embodiment, a configuration of a driver circuit of one embodiment of the present invention will be described with reference to FIG. 1 and FIG. 6.

Figure 6:
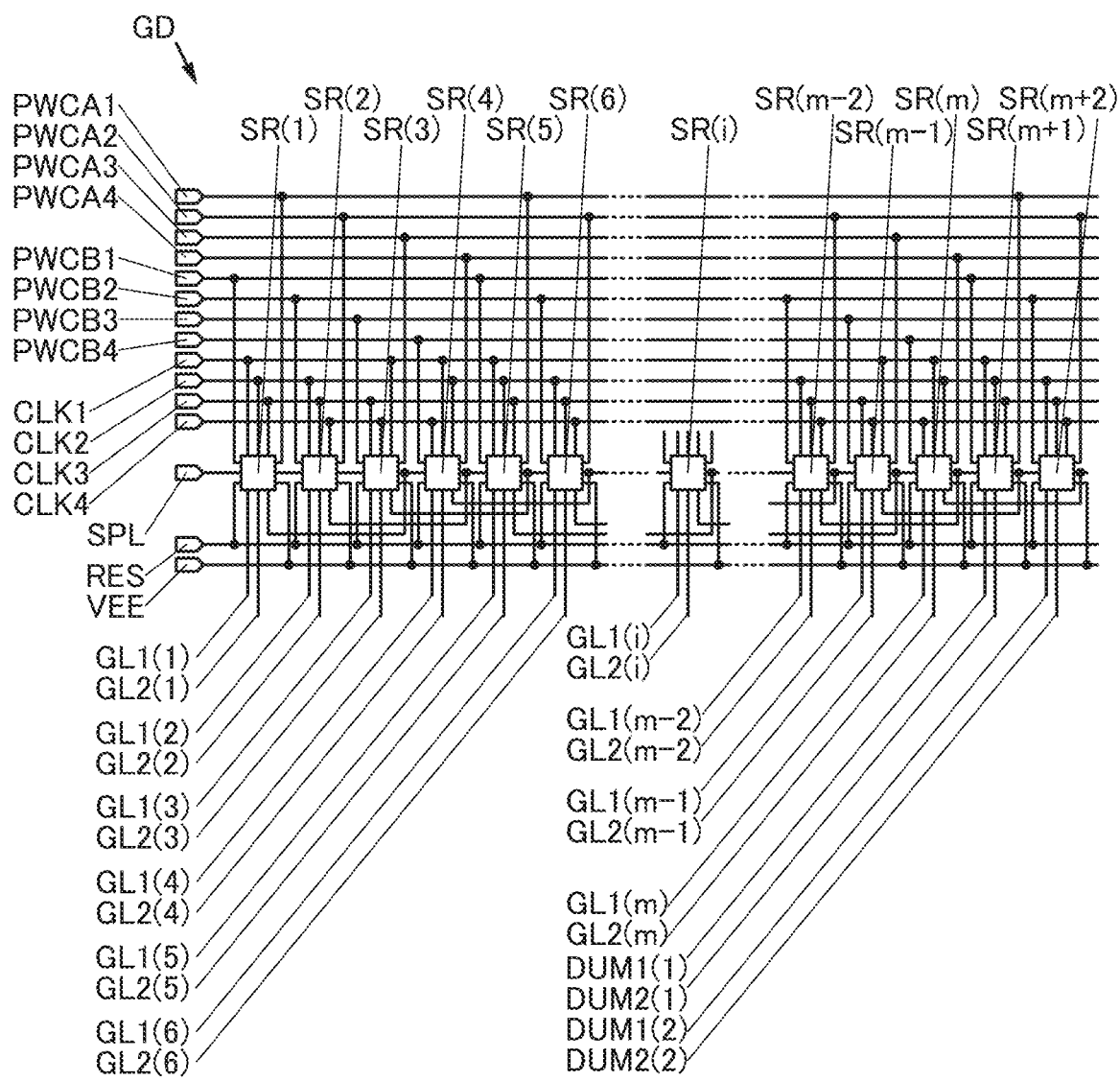
FIG. 6 is a block diagram illustrating a configuration of a driver circuit of one embodiment.

FIG. 6 is a block diagram illustrating the driver circuit of one embodiment of the present invention.

Configuration Example of Driver Circuit GD

A driver circuit GD described in this embodiment includes a group of flip-flop circuits SR(1) to SR(m+2) and a wiring VEE (see FIG. 6). Furthermore, a wiring RES, a wiring DUM1(1), a wiring DUM2(1), a wiring DUM1(2), and a wiring DUM2(2) are included.

The group of flip-flop circuits SR(1) to SR(m+2) includes the flip-flop circuit SR(i) described in Embodiment 1, the flip-flop circuit SR(i+1), and the flip-flop circuit SR(i+2).

<<Flip-Flop Circuit SR(i+1)>>

The flip-flop circuit SR(i+1) is electrically connected to the flip-flop circuit SR(i), and the flip-flop circuit SR(i+1) is supplied with the third trigger signal (see FIG. 1C).

The flip-flop circuit SR(i+1) is electrically connected to the flip-flop circuit SR(i+2).

The flip-flop circuit SR(i+2) supplies the second trigger signal.

<<Wiring VEE>>

The wiring VEE supplies the batch selection signal, and the wiring VEE is electrically connected to the group of the flip-flop circuits SR(1) to SR(m+2).

Accordingly, the group of flip-flop circuits can supply the first selection signals in a predetermined order. Alternatively, the group of flip-flop circuits can supply the second selection signals in a predetermined order. Alternatively, the group of flip-flop circuits can supply the first selection signals simultaneously. As a result, a novel driver circuit that is highly convenient, useful, or reliable can be provided.

<<Connection Example of Input Terminals>>

The input terminal LIN(i) is electrically connected to a wiring SPL or an output terminal OUT(i−1) of the flip-flop circuit SR(i−1), for example (see FIG. 1C and FIG. 6). Note that the wiring SPL supplies a start pulse signal, and the output terminal OUT(i−1) of the flip-flop circuit SR(i−1) supplies the first trigger signal.

The input terminal RIN(i) is electrically connected to OUT(i+2) of the flip-flop circuit SR(i+2). Note that the output terminal OUT(i+2) of the flip-flop circuit SR(i+2) supplies the second trigger signal.

The input terminal E(i) is electrically connected to the wiring VEE. Note that the wiring VEE supplies the batch selection signal.

The input terminal A(i) is electrically connected to any one of a wiring PWCA1 to a wiring PWCA4. Note that the wiring PWCA1 to the wiring PWCA4 each supply the first pulse width modulation signal. For example, a rectangular wave can be used as the first pulse width modulation signal (see FIG. 4A or FIG. 5A).

The input terminal B(i) is electrically connected to any one of a wiring PWCB1 to a wiring PWCB4. Note that the wiring PWCB1 to the wiring PWCB4 each supply a pulse width modulation signal. For example, the same signal as the first pulse width modulation signal can be used as the second pulse width modulation signal (see FIG. 4A). Alternatively, a signal whose pulse width is different from that of the first pulse width modulation signal can be used as the second pulse width modulation signal. Specifically, a signal whose pulse width is shorter than that of the first pulse width modulation signal can be used as the second pulse width modulation signal (see FIG. 5A).

<<Connection Example of Output Terminals>>

The output terminal G1(i) is electrically connected to a scan line GL1(i), and the output terminal G2(i) is electrically connected to a scan line GL2(i) (see FIG. 1C and FIG. 6).

The output terminal OUT(i) is electrically connected to LIN(i+1) of the flip-flop circuit SR(i+1) and RIN(i) of the flip-flop circuit SR(i−2) (see FIG. 6).

Operation Example of Driver Circuit GD

The driver circuit GD of one embodiment of the present invention supplies selection signals sequentially. For example, the flip-flop circuit SR(1) to the flip-flop circuit SR(m+2) sequentially supply selection signals in the period TA (see FIG. 4A and FIG. 5A).

The driver circuit GD of one embodiment of the present invention supplies the batch selection signal. For example, the flip-flop circuit SR(1) to the flip-flop circuit SR(m+2) simultaneously supply selection signals in the period TB.

Note that a period including the period TA and the period TB can be referred to as one sub frame (SUB FRAME) period.

In the case where a liquid crystal element is used as a display element of a display panel, for example, a period LIGHT during which a light source is turned on can be provided after the end of one sub frame period (see FIG. 4A and FIG. 5A).

Note that this embodiment can be combined with other embodiments described in this specification as appropriate.

Embodiment 3

In this embodiment, a structure of a display panel of one embodiment of the present invention will be described with reference to FIG. 7, FIG. 8, and FIG. 10.

Figure 7A:
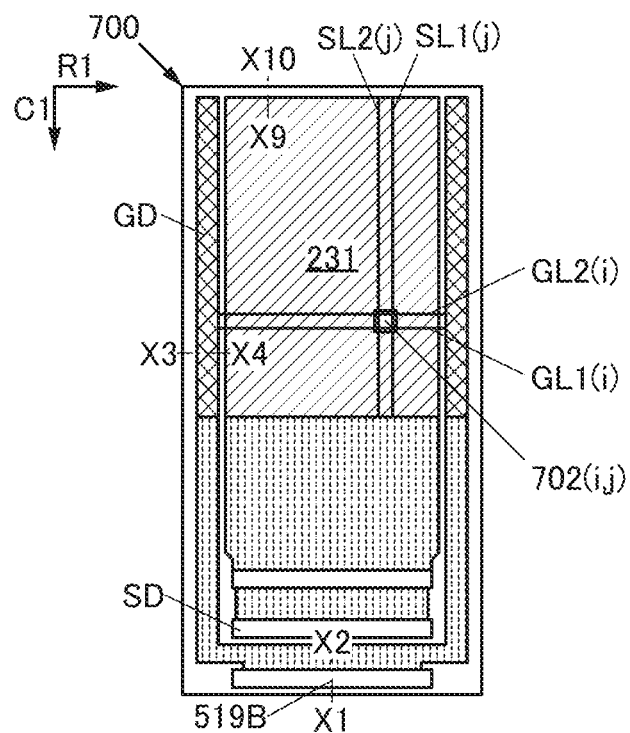
FIG. 7A and FIG. 7B are diagrams illustrating a structure of a display panel of one embodiment.
Figure 7B:
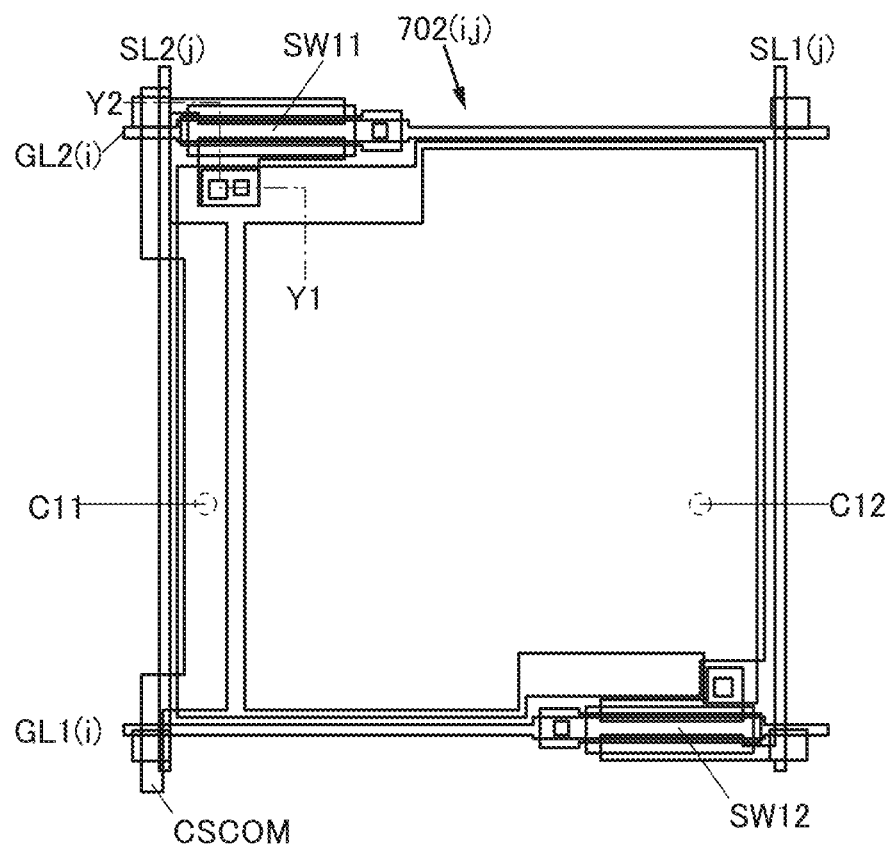

FIG. 7 illustrates the structure of the display panel of one embodiment of the present invention. FIG. 7A is a top view of the display panel of one embodiment of the present invention, and FIG. 7B is part of FIG. 7A.

Figure 8A:
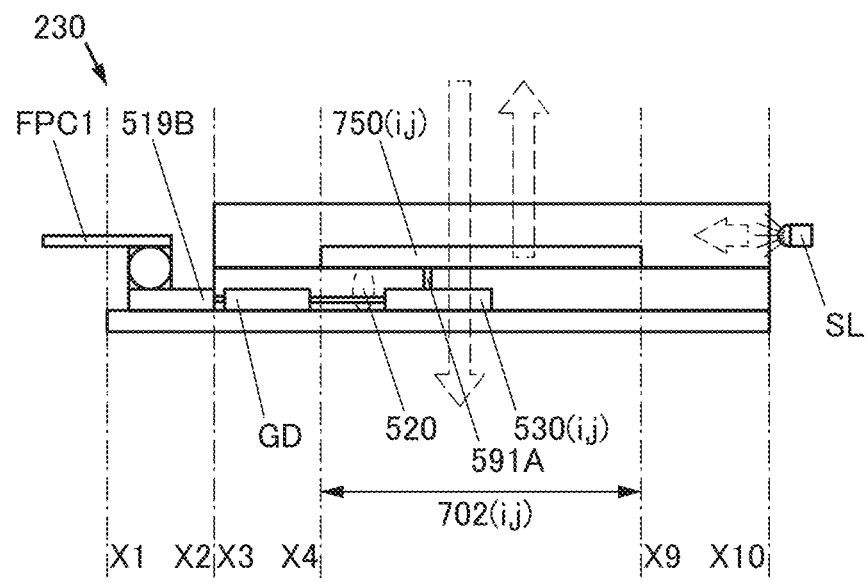
FIG. 8A and FIG. 8B are diagrams illustrating a structure of a display panel of one embodiment.
Figure 8B:
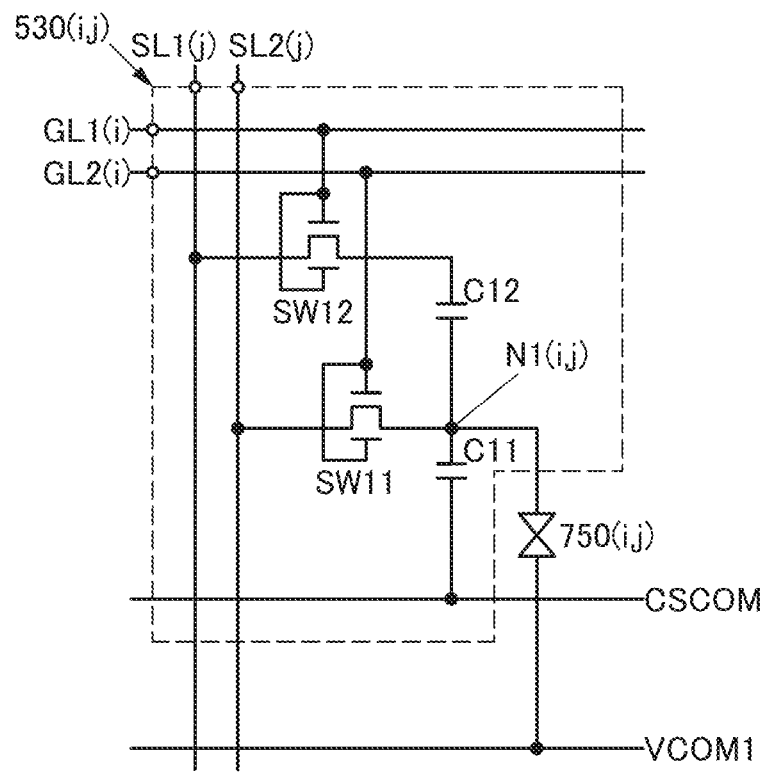

FIG. 8 illustrates the structure of the display panel of one embodiment of the present invention. FIG. 8A is a cross-sectional view taken along cutting lines X1-X2, X3-X4, and X9-X10 and of a pixel in FIG. 7A, and FIG. 8B is a circuit diagram illustrating a configuration of a pixel circuit 530(i, j).

Figure 10:
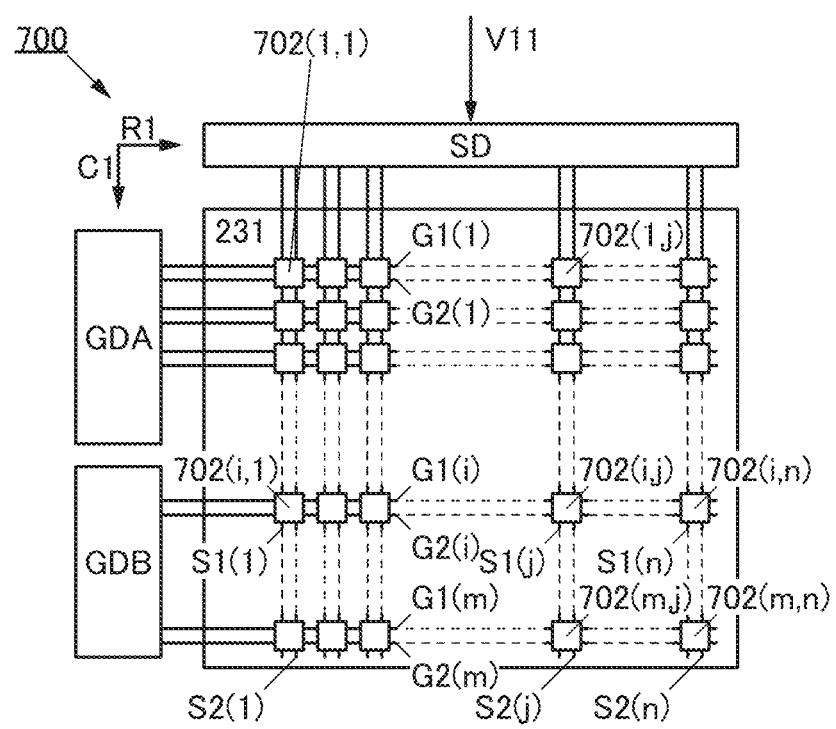
FIG. 10 is a block diagram illustrating a configuration of a display panel of one embodiment.

FIG. 10 is a diagram illustrating the structure of the display panel of one embodiment of the present invention

Structure Example 1 of Display Panel

The display panel described in this embodiment includes a display region 231 and the driver circuit GD described in Embodiment 2 (see FIG. 10).

<<Structure Example 1 of Display Region 231>>

The display region 231 includes the scan line GL1(i), the scan line GL2(i), a signal line SL1(j), a signal line SL2(j), and a pixel 702(i, j).

<<Structure Example 1 of Pixel 702(i, j)>>

The pixel 702(i, j) includes a display element 750(i, j) and the pixel circuit 530(i, j) (see FIG. 8A).

<<Structure Example of Display Element 750(i, j)>>

The display element 750(i, j) is electrically connected to the pixel circuit 530(i, j) (see FIG. 8A and FIG. 8B).

An element that controls light reflection, light transmission, or light emission can be used as the display element, for example. Specifically, an electro-optic element or a light-emitting element can be used as the display element.

<<Structure Example 1 of Pixel Circuit 530(i, j)>>

The pixel circuit 530(i, j) is electrically connected to the scan line GL1(i), the scan line GL2(i), the signal line SL1(j), and the signal line SL2(j) (see FIG. 8B).

The scan line GL1(i) is electrically connected to the output terminal G1(i), and the scan line GL2(i) is electrically connected to the output terminal G2(i) (see FIG. 6).

Accordingly, the first selection signal can be supplied to the first scan line GL1(i). Alternatively, the second selection signal can be supplied to the second scan line GL2(i). Alternatively, the pixel 702(i, j) can be driven using the first selection signal or the second selection signal. As a result, a novel display panel that is highly convenient, useful, or reliable can be provided.

A switch, a transistor, a diode, a resistor, an inductor, a capacitor, or the like can be used in the pixel circuit 530(i, j), for example. Specifically, a transistor can be used as a switch.

For example, in the case where a plurality of transistors are used in the pixel circuit, a semiconductor film of one transistor can be formed in the step of forming a semiconductor film of another transistor.

<<Structure Example 2 of Pixel 702(i, j)>>

In the pixel 702(i, j), a liquid crystal element can be used as the display element 750(i, j).

<<Structure Example 2 of Pixel Circuit 530(i, j)>>

The pixel circuit 530(i, j) includes a capacitor C11, a switch SW11, and a node N1(i, j) (see FIG. 8B).

The switch SW11 includes a first terminal electrically connected to the signal line SL2(j) and a second terminal electrically connected to a first electrode of the display element 750(i, j). Note that the switch SW11 has a function of switching between a conducting state and a non-conducting state on the basis of a selection signal.

The capacitor C11 includes a first electrode electrically connected to the second terminal of the switch SW11 and a second electrode electrically connected to a conductive film CSCOM.

The display element 750(i, j) displays image data on the basis of a potential VN of the node N1(i, j).

<<Structure Example 3 of Pixel Circuit 530(i, j)>>

The pixel circuit 530(i, j) includes the capacitor C11, a capacitor C12, the switch SW11, a switch SW12, and the node N1(i, j).

The switch SW11 includes the first terminal electrically connected to the signal line SL2(j) and the second terminal electrically connected to the first electrode of the display element 750(i, j). Note that the switch SW11 has a function of switching between a conducting state and a non-conducting state on the basis of the second selection signal.

The capacitor C11 includes the first electrode electrically connected to the second terminal of the switch SW11 and the second electrode electrically connected to the conductive film CSCOM.

The switch SW12 includes a first terminal electrically connected to the signal line SL1(j). Note that the switch SW12 has a function of switching between a conducting state and a non-conducting state on the basis of the first selection signal.

The capacitor C12 includes a first electrode electrically connected to a second terminal of the switch SW12 and a second electrode electrically connected to the second terminal of the switch SW11.

The display element 750(i, j) displays image data on the basis of the potential VN of the node N1(i, j).

When the switch SW11 is in a non-conducting state, the switch SW12 can change from a non-conducting state to a conducting state. When the switch SW11 is in a non-conducting state, the switch SW12 can change from a conducting state to a non-conducting state.

[First Step]

In a first step, the switch SW11 and the switch SW12 are brought into a conducting state. For example, the first selection signal is supplied to the scan line GL1(i) and the second selection signal is supplied to the scan line GL2(i).

Furthermore, an image signal is supplied to the capacitor C12. The image signal is supplied using, for example, a potential difference between a potential supplied through the signal line SL1(j) and a potential supplied through the signal line SL2(j).

[Second Step]

In a second step, the switch SW12 is brought into a conducting state while the switch SW11 is kept in a non-conducting state. For example, the batch selection signal is supplied to the scan line GL1(i).

Furthermore, a predetermined potential is supplied to a signal line SL1(i) so as to offset the potential of the node N1(i, j) through the capacitor C12.

[Third Step]

In a third step, image data is displayed using the display element 750(i, j) on the basis of the potential of the node N1(i, j) while the switch SW11 and the switch SW12 are kept in a non-conducting state.

In this manner, the potential of the node N1(i, j) can be controlled using the switch SW11 and the switch SW12. Alternatively, the potential of the node N1(0) can be controlled using the switch SW11, and the potential of the node N1(i, j) can be changed using the switch SW12. Alternatively, the changing potential can be supplied to the display element 750(i, j). Alternatively, image data can be displayed on the basis of the changing potential. Alternatively, the display of the display element 750(i, j) can be changed. Alternatively, an operation of the display element 750(i, j) can be emphasized. Alternatively, the response of the display element 750(i, j) can be made faster. As a result, a novel display panel that is highly convenient, useful, or reliable can be provided.

Alternatively, a high voltage can be supplied to the display element 750(i, j). Alternatively, a high electric field can be applied to a layer 753 containing a liquid crystal material in the display element 750(i, j), for example. Alternatively, the alignment of a polymer-stabilized liquid crystal material can be controlled. As a result, a novel input/output device that is highly convenient, useful, or reliable can be provided.

<<Structure Example 3 of Pixel 702(i, j)>>

Figure 9:
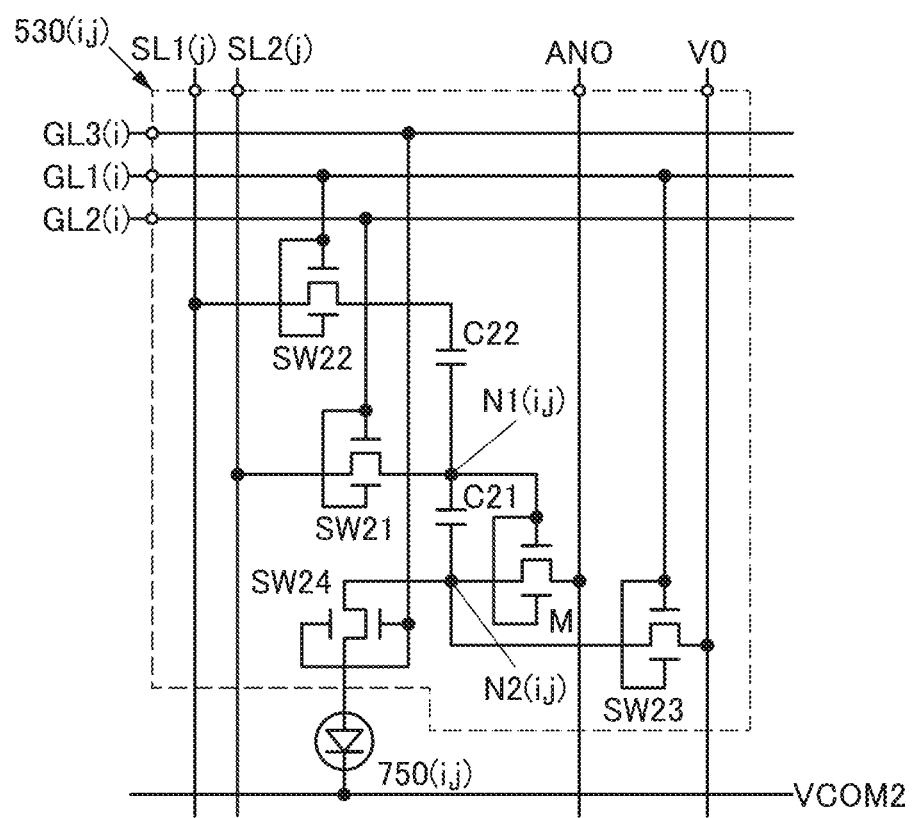
FIG. 9 is a diagram illustrating a configuration of a display panel of one embodiment.

In the pixel 702(i, j), a light-emitting element can be used as the display element 750(i, j) (see FIG. 9). For example, an organic EL element can be used as the display element 750(i, j).

<<Structure Example 4 of Pixel Circuit 530(i, j)>>

The pixel circuit 530(i, j) includes a transistor M, a capacitor C21, a switch SW21, the node N1(i, j), a capacitor C22, and a switch SW22 (see FIG. 9). The pixel circuit 530(i, j) includes a node N2(i, j), a switch SW23, and a switch SW24.

The transistor M includes a first electrode electrically connected to a conductive film ANO.

The capacitor C21 includes a first electrode electrically connected to a gate electrode of the transistor M and a second electrode electrically connected to a second electrode of the transistor M.

The switch SW21 includes a first terminal electrically connected to the signal line SL2(j) and a second terminal electrically connected to the gate electrode of the transistor M. Note that the switch SW21 has a function of switching between a conducting state and a non-conducting state on the basis of the second selection signal.

The capacitor C22 includes a first electrode electrically connected to the gate electrode of the transistor M.

The switch SW22 includes a first terminal electrically connected to the signal line SL1(j) and a second terminal electrically connected to a second electrode of the capacitor C22. Note that the switch SW22 has a function of switching between a conducting state and a non-conducting state on the basis of the first selection signal.

The switch SW23 includes a first terminal electrically connected to the second electrode of the transistor M and a second terminal electrically connected to a conductive film VO. Note that the switch SW23 has a function of switching between a conducting state and a non-conducting state on the basis of the first selection signal.

The switch SW24 includes a first terminal electrically connected to the second electrode of the transistor M and a second terminal electrically connected to the display element 750(i, j). The switch SW24 has a function of switching between a conducting state and a non-conducting state on the basis of a third selection signal. Note that the third selection signal can be supplied using a scan line GL3(i).

When the switch SW21 is in a non-conducting state, the switch SW22 can change from a non-conducting state to a conducting state. When the switch SW21 is in a non-conducting state, the switch SW22 can change from a conducting state to a non-conducting state.

The display element 750(i, j) displays image data on the basis of the potential VN of the node N1(i, j).

In this manner, the potential of the node N1(0) can be controlled using the switch SW21 and the switch SW22. Alternatively, the potential of the node N1(0) can be controlled using the switch SW21, and the potential of the node N1(i, j) can be changed using the switch SW22. Alternatively, the changing potential can be supplied to the display element 750(i, j). Alternatively, image data can be displayed on the basis of the changing potential. Alternatively, the display of the display element 750(i, j) can be changed. Alternatively, the operation of the display element 750(i, j) can be emphasized. Alternatively, the response of the display element 750(i, j) can be made faster. As a result, a novel display panel that is highly convenient, useful, or reliable can be provided.

<<Structure Example 2 of Display Region 231>>

The display region 231 includes a group of pixels 702(i, 1) to 702(i, n) and a different group of pixels 702(1, j) to 702(m, j) (see FIG. 10).

Although not illustrated, the display region 231 includes the conductive film CSCOM and a conductive film VCOM1.

The group of pixels 702(i, 1) to 702(i, n) is arranged in a row direction (a direction indicated by an arrow R1 in the drawing), and the group of pixels 702(i, 1) to 702(i, n) includes the pixel 702(i, j).

The different group of pixels 702(1, j) to 702(m, j) is arranged in a column direction intersecting the row direction (a direction indicated by an arrow C1 in the drawing), and the different group of pixels 702(1, j) to 702(m, j) includes the pixel 702(i, j).

The scan line GL1(i) is electrically connected to the group of pixels 702(i, 1) to 702(i, n), and the scan line GL2(i) is electrically connected to the group of pixels 702(i, 1) to 702(i, n).

The signal line SL1(j) is electrically connected to the different group of pixels 702(1, j) to 702(m, j), and the signal line SL2(j) is electrically connected to the different group of pixels 702(1, j) to 702(m, j).

Accordingly, image data can be supplied to a plurality of pixels. As a result, a novel display panel that is highly convenient, useful, or reliable can be provided.

<<Driver Circuit GDA and Driver Circuit GDB>>

A driver circuit GDA and a driver circuit GDB can be used as the driver circuit GD. For example, the driver circuit GDA and the driver circuit GDB each have a function of supplying a selection signal in response to a control signal SP.

Specifically, the driver circuit GDA and the driver circuit GDB each have a function of supplying a selection signal to one scan line at a frequency of higher than or equal to 30 Hz, preferably higher than or equal to 60 Hz, in response to the control signal SP. Accordingly, a moving image can be smoothly displayed.

Alternatively, the driver circuit GDA and the driver circuit GDB each have a function of supplying a selection signal to one scan line at a frequency of lower than 30 Hz, preferably lower than 1 Hz, further preferably less than once a minute, in response to the control signal SP. Accordingly, a still image in which flickering is reduced can be displayed.

In the case where a plurality of driver circuits are included, for example, the frequency at which the driver circuit GDA supplies a selection signal and the frequency at which the driver circuit GDB supplies a selection signal can be made different from each other. Specifically, a selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, an image can be displayed at a frame frequency of higher than or equal to 1 Hz and lower than or equal to 120 Hz. Alternatively, an image can be displayed at a frame frequency of 120 Hz by a progressive method.

<<Driver Circuit SD>>

A driver circuit SD has a function of generating an image signal on the basis of data V11 and a function of supplying the image signal to a pixel circuit electrically connected to one display element (see FIG. 10).

A variety of sequential circuits such as a shift register can be used as the driver circuit SD, for example.

For example, an integrated circuit formed on a silicon substrate can be used as the driver circuit SD.

The integrated circuit can be connected to a terminal by a COG (Chip on glass) method or a COF (Chip on Film) method, for example. Specifically, an anisotropic conductive film can be used to connect the integrated circuit to a terminal.

Note that this embodiment can be combined with other embodiments described in this specification as appropriate.

Embodiment 4

In this embodiment, a structure of a pixel that can be used in the display panel of one embodiment of the present invention will be described with reference to FIG. 7 to FIG. 12.

Figure 11A:
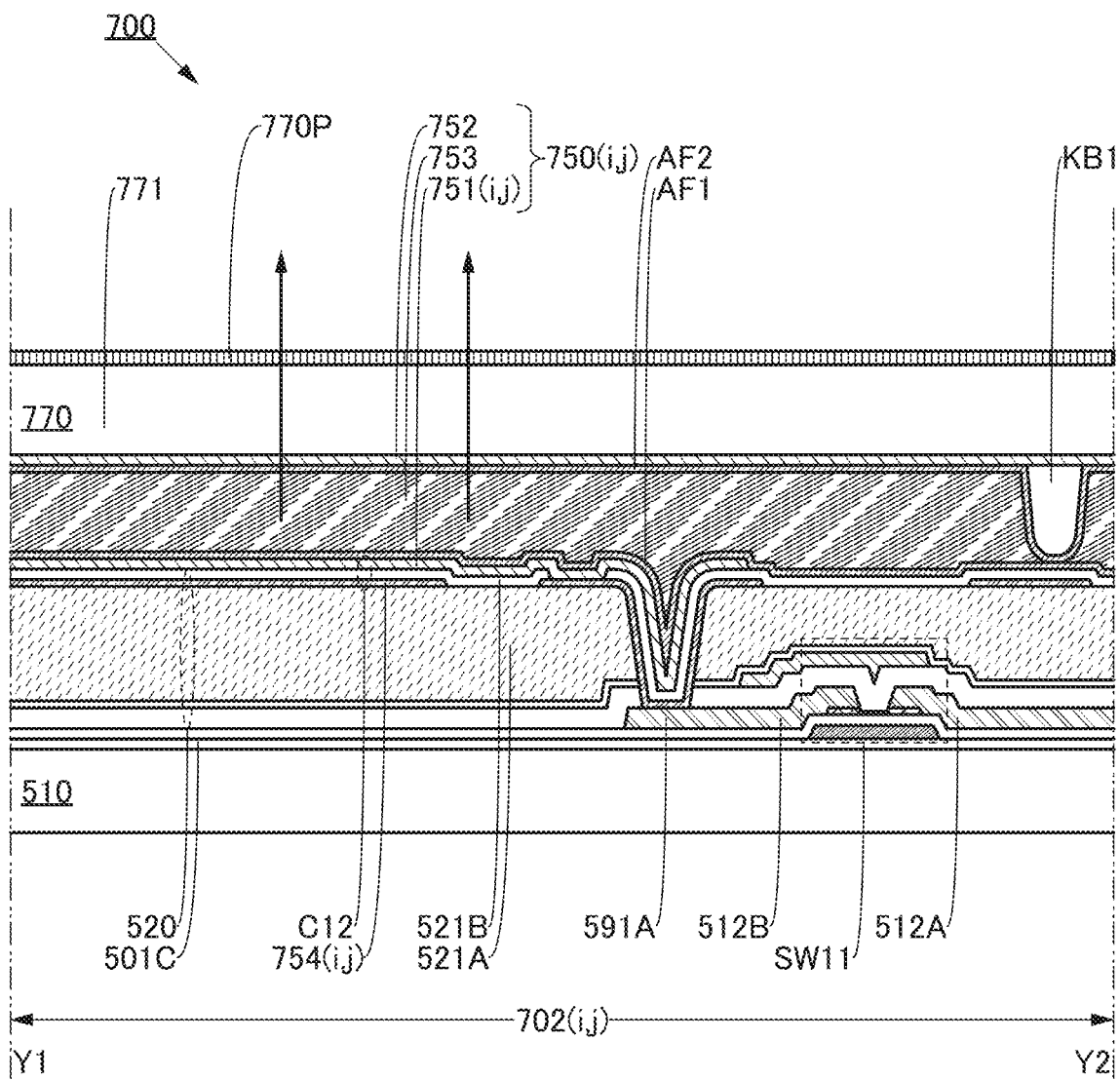
FIG. 11A and FIG. 11B are cross-sectional views illustrating a structure of a display panel of one embodiment.
Figure 11B:
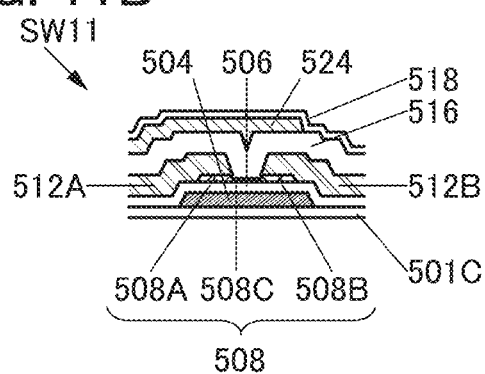

FIG. 11 is a diagram illustrating the structure of the display panel of one embodiment of the present invention. FIG. 11A is a cross-sectional view of the pixel 702(i, j) taken along a cutting line Y1-Y2 in FIG. 7B, and FIG. 11B is a cross-sectional view illustrating part of FIG. 11A.

Figure 12A:
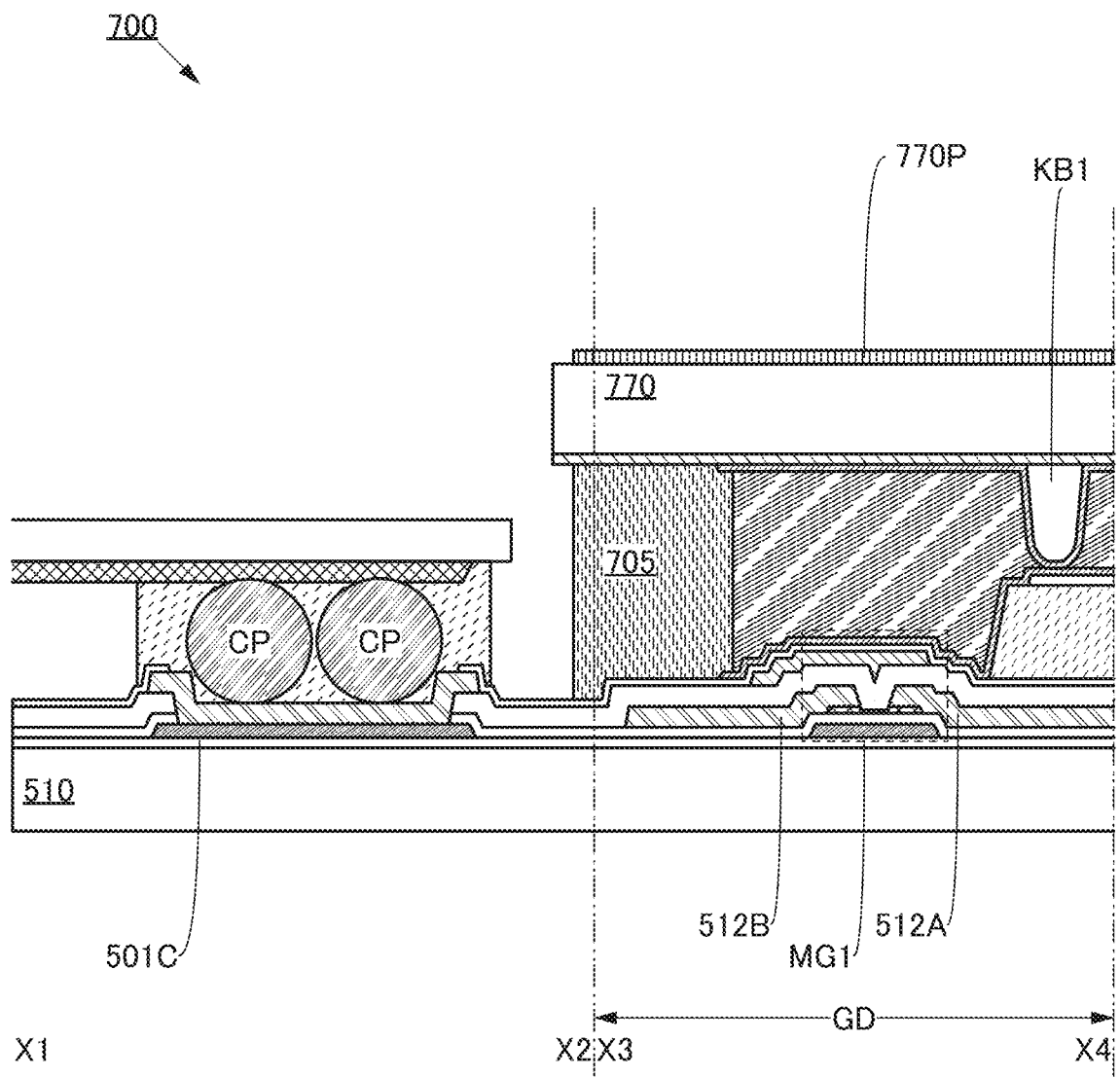
FIG. 12A and FIG. 12B are cross-sectional views illustrating a structure of a display panel of one embodiment.
Figure 12B:
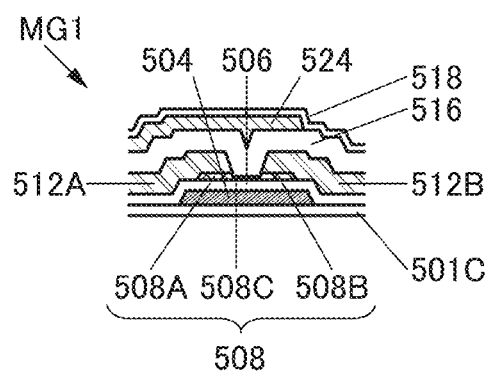

FIG. 12 illustrates the structure of the display panel of one embodiment of the present invention. FIG. 12A is a cross-sectional view taken along cutting lines X1-X2 and X3-X4 in FIG. 7A, and FIG. 12B is a cross-sectional view illustrating part (MGI) of FIG. 12A.

Structure Example 1 of Display Panel 700

The display panel described in this embodiment includes a functional layer 520 (see FIG. 8A).
<<Functional Layer 520>>

The functional layer 520 includes the driver circuit GD described in Embodiment 2 and the pixel circuit 530(i, j) described in Embodiment 3. Note that the functional layer 520 is provided with an opening portion 591A, and the pixel circuit 530(i, j) is electrically connected to the display element 750(i, j) in the opening portion 591A.

Accordingly, a semiconductor film used for a transistor of the driver circuit GD can be formed in a step of forming a semiconductor film used for a transistor of the pixel circuit 530(i, j). Alternatively, the number of components can be reduced. As a result, a novel display panel that is highly convenient, useful, or reliable can be provided.
<<Structure Example of Transistor>>

A bottom-gate transistor, a top-gate transistor, or the like can be used in the driver circuit GD and the pixel circuit 530(i, j), for example (see FIG. 11 and FIG. 12).

The transistor includes a semiconductor film 508, a conductive film 504, a conductive film 512A, and a conductive film 512B (see FIG. 11B).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region sandwiched between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The conductive film 524 includes a region, and the semiconductor film 508 is sandwiched between the region and the conductive film 504. The conductive film 524 has a function of a second gate electrode. The conductive film 524 can be electrically connected to the conductive film 504, for example. Note that the conductive film 524 can be used as the scan line GL2(i).

Note that the semiconductor film used for the transistor of the driver circuit GD can be formed in a step of forming the semiconductor film used for the transistor of the pixel circuit 530(i, j).
<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel using polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor using hydrogenated amorphous silicon for the semiconductor film 508. Alternatively, for example, the driving capability can be higher than that of a transistor using hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor using hydrogenated amorphous silicon for the semiconductor film 508.

Alternatively, for example, the temperature required for fabrication of the transistor can be lower than that required for a transistor using single crystal silicon, for example.

Alternatively, the semiconductor film used for the transistor of the driver circuit can be formed through the same process as the semiconductor film used for the transistor of the pixel circuit. Alternatively, the driver circuit can be formed over the same substrate where the pixel circuit is formed. Alternatively, the number of components included in an electronic device can be reduced.

[Single Crystal Silicon]

For example, single crystal silicon can be used for the semiconductor film 508. In this case, for example, the resolution can be higher than that of a display panel using hydrogenated amorphous silicon for the semiconductor film 508. Alternatively, for example, a display panel having less display unevenness than a display panel using polysilicon for the semiconductor film 508 can be provided. Alternatively, for example, smart glasses or a head mounted display can be provided.
<<Structure Example 2 of Semiconductor Film 508>>

For example, a metal oxide can be used for the semiconductor film 508. Thus, the pixel circuit can hold an image signal for a longer time than a pixel circuit utilizing a transistor using amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of the data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor using amorphous silicon for a semiconductor film can be used, for example. Specifically, a transistor using an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is sandwiched.

A stacked film in which a 400-nm-thick film containing silicon and nitrogen and a 200-nm-thick film containing silicon, oxygen, and nitrogen are stacked can be used as the insulating film 506, for example. Note that the film containing silicon and nitrogen includes a region; between the region and the semiconductor film 508, the film containing silicon, oxygen, and nitrogen is sandwiched.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor using amorphous silicon for a semiconductor can be easily remodeled into a manufacturing line for a bottom-gate transistor using an oxide semiconductor for a semiconductor, for example. Furthermore, a manufacturing line for a top-gate transistor using polysilicon for a semiconductor can be easily remodeled into a manufacturing line for a top-gate transistor using an oxide semiconductor for a semiconductor, for example. In either remodeling, an existing manufacturing line can be effectively utilized.

Accordingly, flickering can be inhibited. Alternatively, power consumption can be reduced. Alternatively, a moving image with quick movements can be smoothly displayed. Alternatively, a photograph and the like can be displayed with a wide range of grayscale. As a result, a novel display panel that is highly convenient, useful, or reliable can be provided.

<<Structure Example 3 of Semiconductor Film 508>>

For example, a compound semiconductor can be used for the semiconductor of the transistor. Specifically, a semiconductor containing gallium arsenide can be used.

For example, an organic semiconductor can be used for the semiconductor of the transistor. Specifically, an organic semiconductor containing any of polyacenes or graphene can be used for the semiconductor film.

<<Structure Example 1 of Capacitor>>

A capacitor includes one conductive film, a different conductive film, and an insulating film. The insulating film includes a region positioned between the one conductive film and the different conductive film.

For example, the conductive film 504, the conductive film 512A, and the insulating film 506 can be used for the capacitor.

The capacitor C12 includes a conductive film 754(*i, j*), an electrode 751(*i, j*), and an insulating film 521B (see FIG. 11A).

<<Structure Example 1 of Functional Layer 520>>

The functional layer 520 includes an insulating film 521, an insulating film 518, an insulating film 516, the insulating film 506, an insulating film 501C, and the like (see FIG. 11A).

The insulating film 521 includes a region sandwiched between the pixel circuit 530(*i, j*) and the display element 750(*i, j*).

The insulating film 518 includes a region sandwiched between the insulating film 521 and the insulating film 501C.

The insulating film 516 includes a region sandwiched between the insulating film 518 and the insulating film 501C.

The insulating film 506 includes a region sandwiched between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Alternatively, a photosensitive material may be used. Thus, the insulating film 521 can eliminate a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The insulating film 518 containing the material that can be used for the insulating film 521 can be used, for example.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities into the semiconductor film of the transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

<<Structure Example 2 of Functional Layer 520>>

The functional layer 520 includes a conductive film, a wiring, and a terminal. A material having conductivity can be used for the wiring, an electrode, the terminal, the conductive film, or the like.

<<Wiring or the Like>>

For example, an inorganic conductive material, an organic conductive material, a metal, a conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing the above-described metal element, or the like can be used for the wiring or the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring or the like. Specifically, a nanowire containing silver can be used.

Specifically, a conductive high molecule can be used for the wiring or the like.

Note that a terminal 519B can be electrically connected to a flexible printed circuit FPC1 using a conductive material ACF1, for example (see FIG. 8A). Specifically, the terminal 519B and the flexible printed circuit FPC1 can be electrically connected to each other using a conductive material CP, for example.

Structure Example 2 of Display Panel 700

A display panel 700 includes a base material 510, a base material 770, and a sealant 705 (see FIG. 12A).

<<Base Material 510 and Base Material 770>>

A material having a light-transmitting property can be used for the base material 510 or the base material 770.

For example, a flexible material can be used for the base material 510 or the base material 770. Thus, a flexible display panel can be provided.

For example, a material with a thickness of less than or equal to 0.7 mm and greater than or equal to 0.1 mm can be used. Specifically, a material polished to a thickness of approximately 0.1 mm can be used. Thus, the weight can be reduced.

A glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be fabricated.

For the base material 510 or the base material 770, an organic material, an inorganic material, a composite material of an organic material and an inorganic material or the like can be used, for example.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate of silicon or silicon carbide, a polycrystalline semiconductor substrate, a compound semiconductor substrate of silicon germanium or the like, an SOI substrate, or the like can be used as the base material 510 or the base material 770. Thus, a semiconductor element can be formed over the base material 510 or the base material 770.

For example, an organic material such as resin, a resin film, or plastic can be used for the base material 510 or the base material 770. Specifically, a material containing polyester, polyolefin, polyamide (nylon, aramid, or the like), polyimide, polycarbonate, polyurethane, an acrylic resin, an epoxy resin, or a resin having a siloxane bond can be used for the base material 510 or the base material 770. For example, a resin film, a resin plate, a stacked-layer material, or the like containing any of these materials can be used. Thus, the weight can be reduced. Alternatively, for example, the frequency of occurrence of breakage or the like due to dropping can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Alternatively, diffusion of impurities contained in glass or resin can be prevented. Alternatively, diffusion of impurities that pass through resin can be prevented.

Furthermore, paper, wood, or the like can be used for the base material 510 or the base material 770.

For example, a material having heat resistance high enough to withstand heat treatment in the fabricating process can be used for the base material 510 or the base material 770. Specifically, a material having heat resistance to heat applied in the formation process of directly forming the transistor, the capacitor, or the like can be used for the base material 510 or the base material 770.

For example, a method in which an insulating film, a transistor, a capacitor, or the like is formed on a substrate which is for use in the process and has heat resistance to heat applied in the fabricating process, and the formed insulating film, transistor, capacitor, or the like is transferred to the base material 510 or the base material 770 can be used. Accordingly, an insulating film, a transistor, a capacitor, or the like can be formed on a flexible substrate, for example.

<<Sealant 705>>

The sealant 705 includes a region sandwiched between the functional layer 520 and the base material 770 and has a function of bonding the functional layer 520 and the base material 770 together (see FIG. 12).

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

Structure Example 3 of Display Panel 700

The display panel 700 includes a structure body KB1, a functional film 770P, or the like (see FIG. 11A). Note that a coloring film, a light-blocking film, or the like can be used between the functional layer 520 and the base material 770.

<<Structure Body KB1>>

The structure body KB1 includes a region sandwiched between the functional layer 520 and the base material 770. The structure body KB1 has a function of providing a predetermined space between the functional layer 520 and the base material 770.

<<Functional Film 770P and the Like>>

The functional film 770P includes a region overlapping with the display element 750(i, j).

An anti-reflection film, a polarizing film, a retardation film, a light diffusion film, a condensing film, or the like can be used as the functional film 770P, for example.

For example, an anti-reflection film with a thickness of less than or equal to 1 μm can be used as the functional film 770P. Specifically, a stacked film in which three or more layers, preferably five or more layers, further preferably 15 or more layers of dielectrics are stacked can be used as the functional film 770P. This allows the reflectance to be as low as 0.5% or less, preferably 0.08% or less.

For example, a circularly polarizing film can be used as the functional film 770P.

Furthermore, an antistatic film inhibiting the attachment of a dust, a water repellent film inhibiting the attachment of a stain, an oil repellent film inhibiting the attachment of a stain, an antireflective film (anti-reflection film), a non-glare film (anti-glare film), a hard coat film inhibiting generation of a scratch in use, a self-healing film inhibiting generation of a scratch in use, or the like can be used as the functional film 770P.

<<Structure Example of Display Element>>

An element that controls light reflection, light transmission, or light emission can be used as the display element, for example. Specifically, an electro-optic element or a light-emitting element can be used as the display element.

<<Structure Example 1 of Display Element 750(i, j)>>

A liquid crystal element, an electrophoretic element, an electronic ink, or the like can be used as the display element 750(i, j), for example (see FIG. 11A).

A reflective liquid crystal element can be used as the display element 750(i, j), for example. The use of a reflective display element can suppress power consumption of the display panel.

A transmissive liquid crystal element can be used as the display element 750(i, j), for example. The display panel 700 has a function of displaying an image by controlling transmission of light emitted by a backlight BL.

<<Structure Example 1 of Liquid Crystal Element>>

For example, a liquid crystal element that can be driven by a driving method such as an IPS (In-Plane-Switching) mode, a TN (Twisted Nematic) mode, an FFS (Fringe Field Switching) mode, an ASM (Axially Symmetric aligned Micro-cell) mode, an OCB (Optically Compensated Birefringence) mode, an FLC (Ferroelectric Liquid Crystal) mode, or an AFLC (AntiFerroelectric Liquid Crystal) mode can be used.

A liquid crystal element that can be driven by, for example, a vertical alignment (VA) mode, specifically, a driving method such as an MVA (Multi-Domain Vertical Alignment) mode, a PVA (Patterned Vertical Alignment) mode, an ECB (Electrically Controlled Birefringence) mode, a CPA (Continuous Pinwheel Alignment) mode, or an ASV (Advanced Super-View) mode can be used.

<<Structure Example 2 of Display Element 750(i, j)>>

The display element 750(i, j) includes the electrode 751(i, j), an electrode 752, and the layer 753 containing a liquid crystal material. The display element 750(i, j) also includes an alignment film AF1 and an alignment film AF2.

The electrode 751(i, j) is electrically connected to the pixel circuit 530(i, j) in the opening portion 591A.

The electrode 752 is arranged such that an electric field controlling the alignment of a liquid crystal material is formed between the electrode 751(i, j) and the electrode 752.

<<Layer 753 Containing Liquid Crystal Material>>

The layer 753 containing a liquid crystal material includes a region positioned between the alignment film AF1 and the alignment film AF2.

For example, a liquid crystal material having a resistivity greater than or equal to $1.0 \times 10^{13}$ Ω·cm, preferably greater than or equal to $1.0 \times 10^{14}$ Ω·cm, further preferably greater than or equal to $1.0 \times 10^{15}$ Ω·cm can be used for the layer 753 containing a liquid crystal material.

Accordingly, it is possible to make it difficult for current to flow in the layer 753 containing a liquid crystal material. Alternatively, an electric field applied to the layer 753 containing a liquid crystal material can be maintained. Alternatively, a variation in the transmittance of the display element 750(i, j) can be inhibited. Alternatively, flickering of the display element 750(i, j) can be inhibited. Alternatively, the rewriting frequency of the display element 750(i, j) can be reduced.

<<Structure Example 3 of Display Element 750(i, j)>>

The display element 750(i, j) described in this embodiment includes the electrode 751(i, j), the electrode 752, and the layer 753 containing a liquid crystal material. Furthermore, the alignment film AF1 and the alignment film AF2 are included (see FIG. 11A).

<<Structure Example of Alignment Film AF1 and Alignment Film AF2>>

The alignment film AF1 includes a region positioned between the electrode 751(i, j) and the layer 753 containing a liquid crystal material. The alignment film AF2 includes a region positioned between the electrode 752 and the layer 753 containing a liquid crystal material.

An alignment film for aligning liquid crystals in a substantially horizontal direction can be used as the alignment film AF1 and the alignment film AF2. For example, the pretilt angle can be set to approximately 2° to 5°.

Note that the alignment film AF2 is subjected to rubbing treatment so as to be antiparallel with the alignment film AF1. The thickness of the alignment film AF1 or the alignment film AF2 can be, for example, 70 nm.

<<Structure Example of Electrode 751(i, j) and Electrode 752>>

The electrode 752 is arranged such that an electric field crossing the layer 753 containing a liquid crystal material is formed between the electrode 751(i, j) and the electrode 752.

<<Structure Example 1 of Layer 753 Containing Liquid Crystal Material>>

The layer 753 containing a liquid crystal material scatters incident light $I_0$ with a first scattering intensity when the electric field is in a first state.

The layer 753 containing a liquid crystal material scatters the incident light $I_0$ with a second scattering intensity when the electric field is in a second state where the electric field is stronger than that in the first state. Note that the second scattering intensity is higher than the first scattering intensity.

Note that the thickness of the layer 753 containing a liquid crystal material can be, for example, greater than or equal to 2.5 μm and less than or equal to 6.0 μm.

<<Structure Example 2 of Layer 753 Containing Liquid Crystal Material>>

The layer 753 containing a liquid crystal material contains a liquid crystal material and a high molecular material and the layer 753 containing a liquid crystal material is stabilized with a polymer.

<<Structure Example of Liquid Crystal Material>>

For example, MDA-00-3506, a liquid crystal material produced by Merck KGaA, can be used for the layer 753 containing a liquid crystal material.

<<Structure Example of High Molecular Material>>

The high molecular material is a copolymer of a polyfunctional monomer and a monofunctional monomer.

<<Structure Example of Polyfunctional Monomer>>

The polyfunctional monomer has a phenyl benzoate skeleton. For example, diacrylate having a phenyl benzoate skeleton can be used as the polyfunctional monomer. Specifically, a material represented by the following structural formula (1) can be used as the polyfunctional monomer.

[Chemical Formula 1]

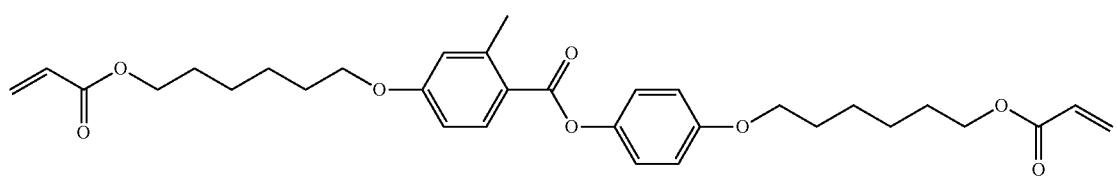

(1)

<<Structure Example of Monofunctional Monomer>>

The monofunctional monomer has a cyclohexylbenzene skeleton. For example, acrylate having a cyclohexyl skeleton can be used as the monofunctional monomer. Specifically, materials represented by the following structural formula (2) to structural formula (4) can be used as the monofunctional monomer.

[Chemical Formula 2]

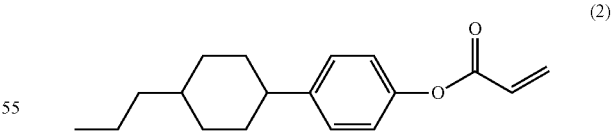

(2)

[Chemical Formula 3]

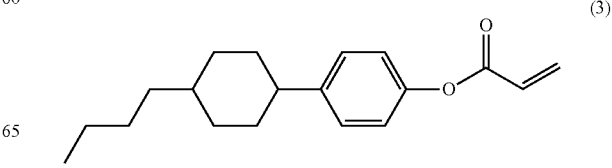

(3)

[Chemical Formula 4]

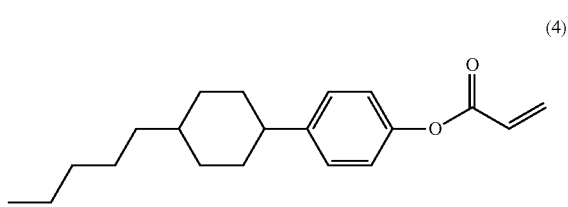

(4)

Thus, incident light can be scattered more strongly with a second electric field intensity that is higher than a first electric field intensity. The power consumed in the state of easily transmitting incident light can be reduced. As a result, a novel liquid crystal element that is highly convenient, useful, or reliable can be provided.

Note that phenyl benzoate has a structure represented by the structural formula (5) and cyclohexylbenzene has a structure represented by the structural formula (6). Both phenyl benzoate and cyclohexylbenzene may have a substituent.

[Chemical Formula 6]

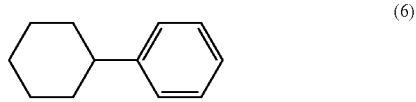

(6)

Structure Example 2 of Liquid Crystal Element

The second scattering intensity of the liquid crystal element described in this embodiment is 10 or more times the first scattering intensity.

Thus, the contrast between the state of transmitting incident light and the state of scattering incident light can be increased. As a result, a novel liquid crystal element that is highly convenient, useful, or reliable can be provided.

Note that this embodiment can be combined with other embodiments described in this specification as appropriate.

Embodiment 5

In this embodiment, a structure of a display device of one embodiment of the present invention will be described with reference to FIG. 13.

FIG. 13 illustrates the structure of the display device of one embodiment of the present invention. FIG. 13A is a block diagram of the display device of one embodiment of the present invention, and FIG. 13B to FIG. 13D are projection views each illustrating the appearance of the display device of one embodiment of the present invention.

Structure Example 1 of Display Device

Figure 13A:
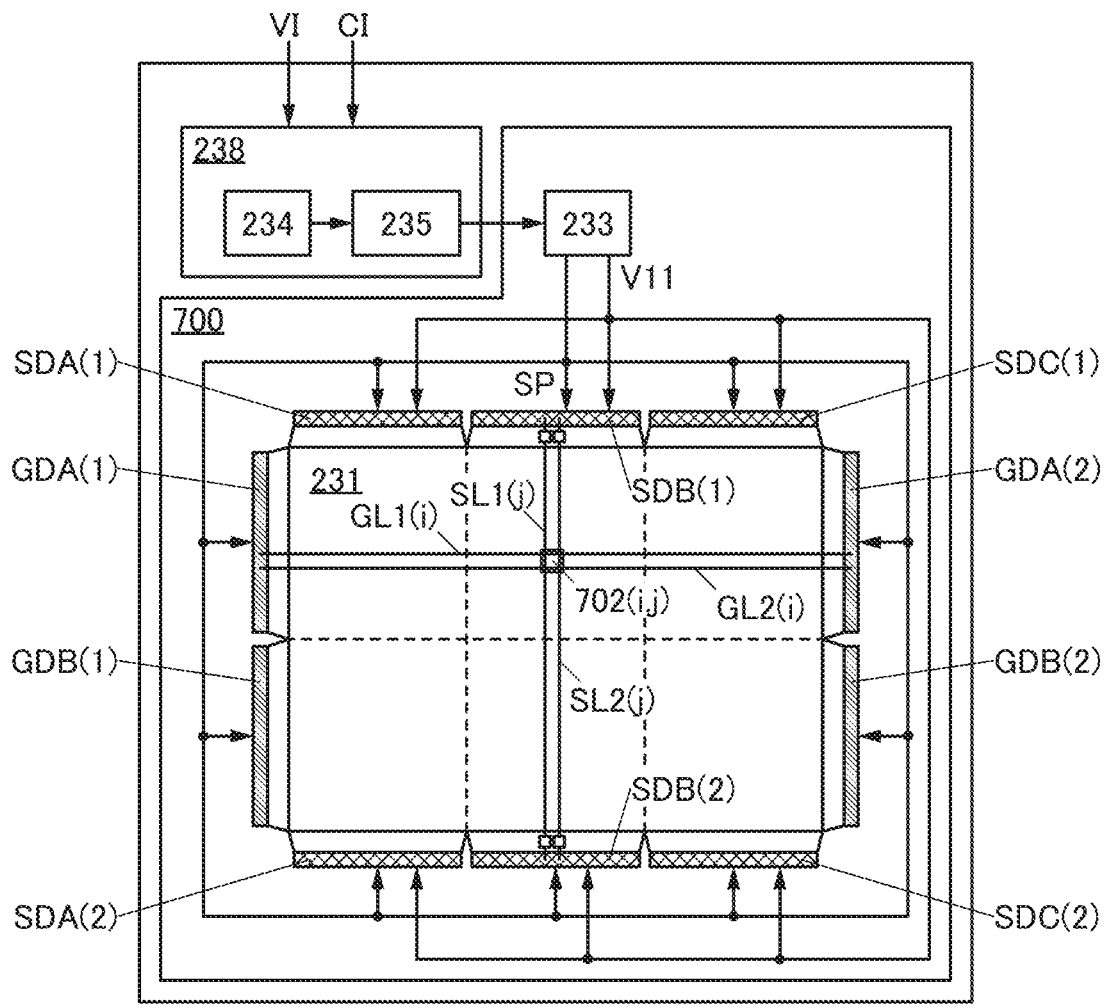
FIG. 13A to FIG. 13D are diagrams each illustrating a structure of a display device of one embodiment.
Figure 13B:
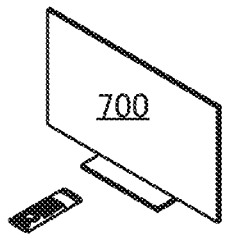
Figure 13C:
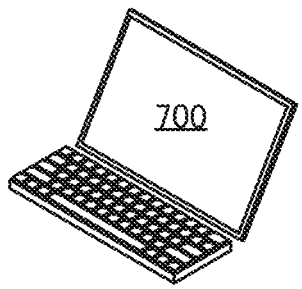
Figure 13D:
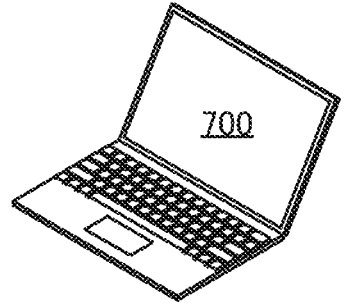

The display device described in this embodiment includes the display panel 700 and a control portion 238 (see FIG. 13A).

<<Structure Example 1 of Control Portion 238>>

The control portion 238 is supplied with image data VI and control data CI. For example, a clock signal, a timing signal, or the like can be used as the control data CI.

The control portion 238 generates data V11 on the basis of the image data VI and generates the control signal SP on the basis of the control data CI. Furthermore, the control portion 238 supplies the data V11 and the control signal SP.

The data V11 includes a grayscale of 8 bits or more, preferably 12 bits or more, for example. In addition, a clock signal, a start pulse, or the like of a shift register used for a driver circuit can be used as the control signal SP, for example.

<<Structure Example 2 of Control Portion 238>>

For example, a decompression circuit 234 and an image processing circuit 235 can be used in the control portion 238.

<<Decompression Circuit 234>>

The decompression circuit 234 has a function of decompressing the image data VI supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data VI, for example.

The image processing circuit 235 has a function of generating the data V11 by correcting the image data VI on the basis of a predetermined characteristic curve and a function of supplying the data V11, for example.

<<Structure Example 1 of Display Panel>>

The display panel 700 is supplied with the data V11 and the control signal SP. For example, a driver circuit can be used in the display panel 700. Specifically, the display panel 700 described in Embodiment 3 or Embodiment 4 can be used.

<<Driver Circuit>>

The driver circuit operates on the basis of the control signal SP. Using the control signal SP enables a synchronized operation of a plurality of driver circuits.

For example, a driver circuit GDA(1), a driver circuit GDA(2), a driver circuit GDB(1), and a driver circuit GDB(2) can be used in the display panel. Specifically, the driver circuit described in Embodiment 2 can be used. The driver circuit GDA(1), the driver circuit GDA(2), the driver circuit GDB(1), and the driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and a driver circuit SDC(2) can be used in the display panel. The driver circuit SDA(1), the driver circuit SDA(2), the driver circuit SDB(1), the driver circuit SDB(2), the driver circuit SDC(1), and the driver circuit SDC(2) are supplied with the control signal SP and the data V11 and capable of supplying an image signal.

<<Structure Example of Pixel 702(i, j)>>

The pixel 702(i, j) displays image data on the basis of the data V11.

Thus, the image data can be displayed using the display element. As a result, a novel display device that is highly convenient, useful, or reliable can be provided. Alternatively, for example, a television receiver system (see FIG. 13B), a video monitor (see FIG. 13C), a notebook computer (see FIG. 13D), or the like can be provided.

<<Structure Example 2 of Display Panel>>

For example, a control circuit 233 can be used for the display panel 700. Specifically, the control circuit 233 formed over a rigid substrate can be used for the display panel 700. The control circuit 233 formed over the rigid substrate can be electrically connected to the control portion 238 with the use of a flexible printed circuit.

<<Control Circuit 233>>

The control circuit 233 has a function of generating and supplying the control signal SP. For example, a clock signal, a timing signal, or the like can be used as the control signal SP. Specifically, a timing controller can be used as the control circuit 233.

Structure Example 2 of Display Device

Figure 14A:
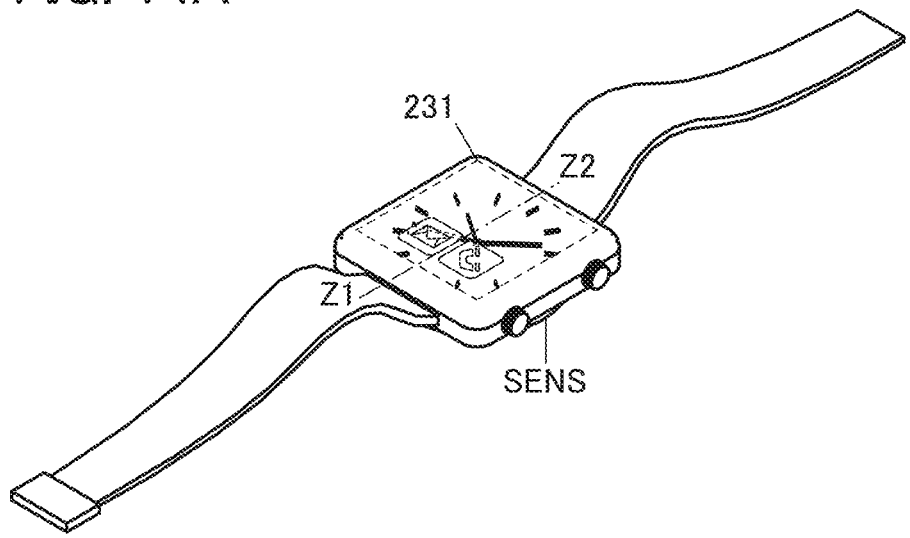
FIG. 14A to FIG. 14C are diagrams illustrating a structure of a display device of one embodiment.
Figure 14B:
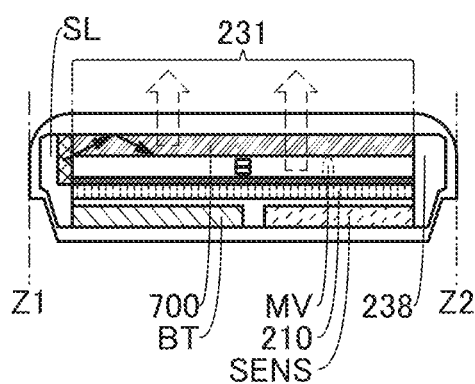

The display device described in this embodiment includes the display panel 700 and the control portion 238 (see FIG. 14A and FIG. 14B). Furthermore, a light source SL, an arithmetic unit 210, a sensor SENS, a driving portion MV, and a battery BT are included.

For example, the display panel described in Embodiment 3 or Embodiment 4 can be used as the display panel 700.

<<Structure Example 1 of Light Source SL>>

The light source SL is supplied with the control data CI. For example, a clock signal, a timing signal, or the like can be used as the control data CI.

The light source SL includes a light-emitting element and a driver circuit. The light-emitting element is electrically connected to the driver circuit.

An LED, an organic EL element, or the like can be used as the light source SL, for example. Specifically, a light-emitting element that emits white light can be used as the light source SL. Alternatively, a light-emitting element that emits blue light, a light-emitting element that emits green light, and a light-emitting element that emits red light can be used as the light source SL.

The driver circuit can simultaneously turn on the light-emitting element that emits blue light, the light-emitting element that emits green light, and the light-emitting element that emits red light. Alternatively, the light-emitting element that emits blue light, the light-emitting element that emits green light, and the light-emitting element that emits red light can be sequentially turned on.

<<Structure Example 2 of Light Source SL>>

Figure 14C:
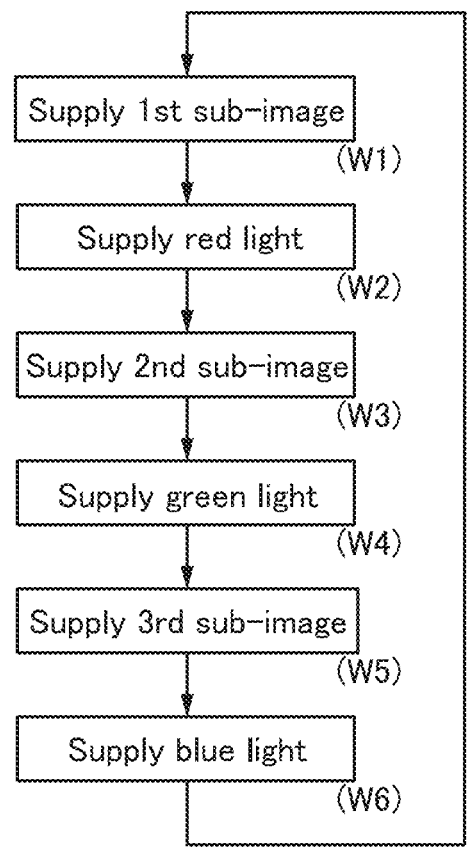

The light source SL can display the image data VI on the basis of the control data CI by a field-sequential method, for example (see FIG. 14C).

[First Step]

As first sub-image data, a red component of predetermined image data is supplied, for example (see (W1) in FIG. 14C).

[Second Step]

The first sub-image data is displayed by emitting red light using the light source SL (see (W2) in FIG. 14C).

[Third Step]

As second sub-image data, a green component of the predetermined image data is supplied, for example (see (W3) in FIG. 14C).

[Fourth Step]

The second sub-image data is displayed by emitting green light using the light source SL (see (W4) in FIG. 14C).

[Fifth Step]

As third sub-image data, a blue component of the predetermined image data is supplied, for example (see (W5) in FIG. 14C).

[Sixth Step]

The third sub-image data is displayed by emitting blue light using the light source SL (see (W6) in FIG. 14C).

<<Sensor SENS>>

The sensor SENS supplies sensing data DS. A pulse sensor, a temperature sensor, a pressure sensor, or the like can be used as the sensor SENS, for example.

<<Arithmetic Unit 210>>

The arithmetic unit 210 is supplied with the sensing data DS. The arithmetic unit 210 generates the image data VI on the basis of the sensing data DS.

For example, the image data VI for displaying user's pulse, body temperature, or the like can be generated on the basis of the sensing data DS. Alternatively, the image data VI for displaying atmospheric temperature, elevation, the depth of water, or the like can be generated on the basis of the sensing data DS.

The arithmetic unit 210 supplies time data or the like.

<<Driving Portion MV>>

The driving portion MV includes an hour hand, a minute hand, a second hand, a motor, and a driver circuit, for example. The driving portion MV is supplied with time data or the like to display time or the like. For example, the hour hand, the minute hand, and the second hand can rotate at a predetermined speed. Furthermore, a pulse, body temperature, atmospheric temperature, elevation, the depth of water, or the like can be displayed.

Note that the display panel 700 is provided so as to be positioned between the user and the driving portion MV. Accordingly, the image data can be displayed in front of the hands such as the hour hand, the minute hand, and the second hand, for example. Alternatively, the image data VI can be superimposed on the hands such as the hour hand, the minute hand, and the second hand. Alternatively, the image data VI can be displayed without being blocked from view by the hands such as the hour hand, the minute hand, and the second hand.

<<Battery BT>>

The battery BT is electrically connected to the display panel 700, the control portion 238, the light source SL, the sensor SENS, the arithmetic unit 210, and the driving portion MV. The battery BT supplies power.

Note that this embodiment can be combined with other embodiments described in this specification as appropriate.

Embodiment 6

In this embodiment, a structure of an input/output device of one embodiment of the present invention will be described with reference to FIG. 15.

Figure 15:
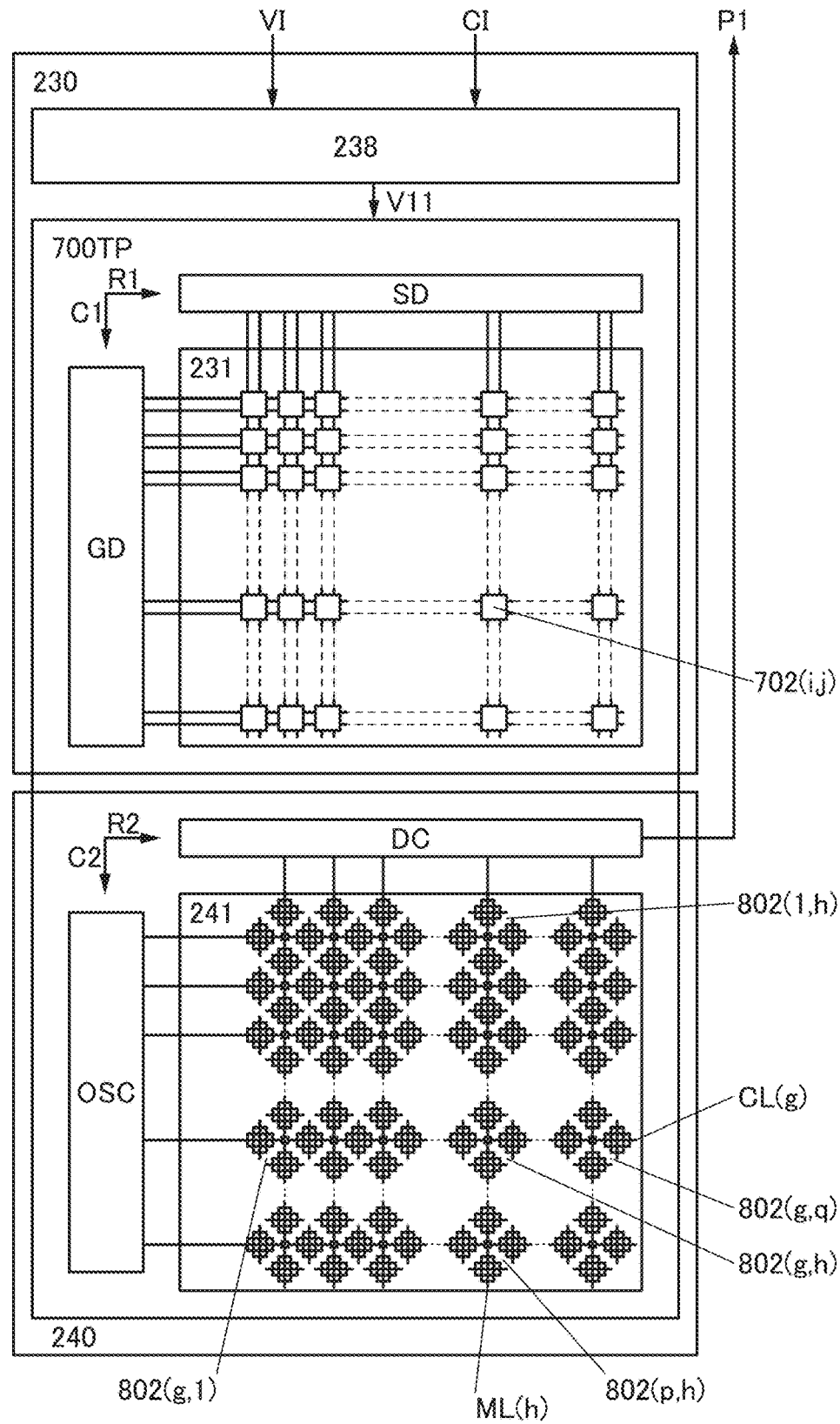
FIG. 15 is a block diagram illustrating a structure of an input/output device of one embodiment.

FIG. 15 is a block diagram illustrating the structure of the input/output device of one embodiment of the present invention.

Structure Example 1 of Input/Output Device

The input/output device described in this embodiment includes an input portion 240 and a display portion 230 (see FIG. 15).

<<Display Portion 230>>

The display portion 230 includes a display panel. For example, the display panel 700 described in Embodiment 3 or Embodiment 4 can be used for the display portion 230. Note that a structure including the input portion 240 and the display portion 230 can be referred to as an input/output panel 700TP.

<<Structure Example 1 of Input Portion 240>>

The input portion 240 includes a sensing region 241. The input portion 240 has a function of sensing an object approaching the sensing region 241.

The sensing region 241 includes a region overlapping with the pixel 702(i, j).

Accordingly, an object approaching a region overlapping with the display portion can be sensed while image data is displayed using the display portion. Alternatively, a finger or the like that approaches the display portion can be used as a pointer to input positional data. Alternatively, positional data can be associated with image data displayed on the display portion. As a result, a novel input/output device that is highly convenient, useful, or reliable can be provided.

<<Structure Example 1 of Sensing Region 241>>

The sensing region 241 includes one or a plurality of sensors, for example.

The sensing region 241 includes a group of sensors 802(g, 1) to 802(g, q) and a different group of sensors 802(1, h) to 802(p, h). Note that g is an integer greater than or equal to 1 and less than or equal to p, h is an integer greater than or equal to 1 and less than or equal to q, and p and q are each an integer greater than or equal to 1.

The group of sensors 802(g, 1) to 802(g, q) includes a sensor 802(g, h), is provided in a row direction (the direction indicated by an arrow R2 in the drawing), and is electrically connected to a wiring CL(g). Note that the direction indicated by the arrow R2 may be the same as or different from the direction indicated by the arrow R1.

The different group of sensors 802(1, h) to 802(p, h) includes the sensor 802(g, h), is provided in a column direction (the direction indicated by an arrow C2 in the drawing) that intersects the row direction, and is electrically connected to a wiring ML(h).

<<Sensor>>

The sensor has a function of sensing an approaching pointer. For example, a finger or a stylus pen can be used as the pointer. For example, a piece of metal or a coil can be used for the stylus pen.

Specifically, a capacitive proximity sensor, an electromagnetic inductive proximity sensor, an optical proximity sensor, a resistive proximity sensor, or the like can be used as the sensor.

A plurality of types of sensors can be used in combination. For example, a sensor that senses a finger and a senor that senses a stylus pen can be used in combination.

This allows determination of the kind of a pointer. Alternatively, different instructions can be associated with sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a finger can be sensed using a capacitive, pressure-sensitive, or optical proximity sensor. Alternatively, a stylus pen can be sensed using an electromagnetic inductive or optical proximity sensor.

<<Structure Example 2 of Input Portion 240>>

The input portion 240 includes an oscillation circuit OSC and a sensing circuit DC (see FIG. 15).

The oscillation circuit OSC supplies a search signal to the sensor 802(g, h). For example, a rectangular wave, a sawtooth wave, a triangular wave, or a sine wave can be used as the search signal.

The sensor 802(g, h) generates and supplies a sensing signal that changes in accordance with the search signal and the distance to a pointer approaching the sensor 802(g, h).

The sensing circuit DC supplies input data in response to the sensing signal.

Accordingly, the distance from an approaching pointer to the sensing region 241 can be sensed. Alternatively, the position in the sensing region 241 where the pointer comes the closest can be sensed.

Note that this embodiment can be combined with other embodiments described in this specification as appropriate.

Embodiment 7

In this embodiment, a structure of a data processing device of one embodiment of the present invention will be described with reference to FIG. 16 to FIG. 18

Figure 16A:
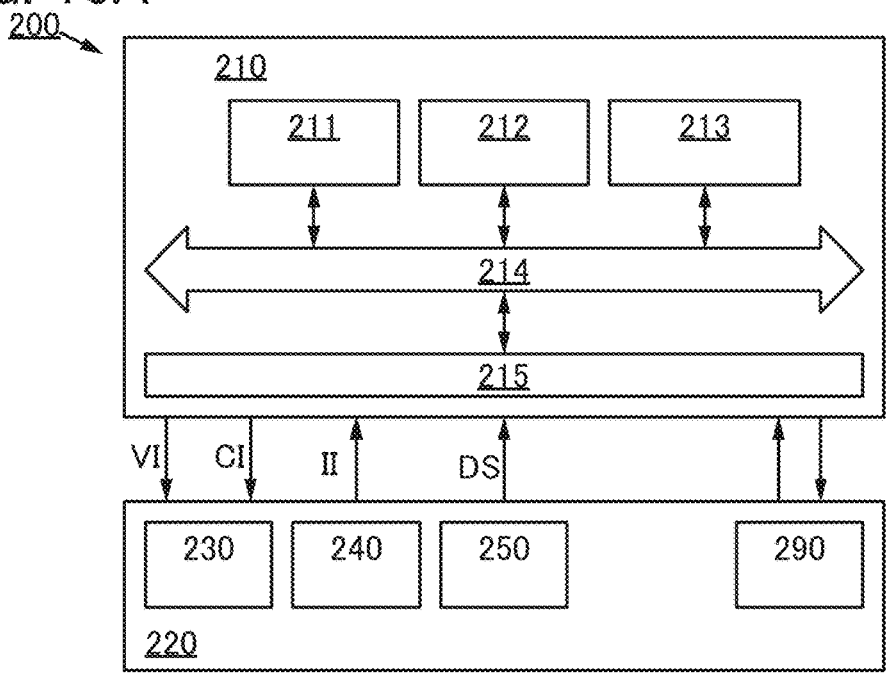
FIG. 16A to FIG. 16C are a block diagram and projection views illustrating a structure of a data processing device of one embodiment.
Figure 16B:
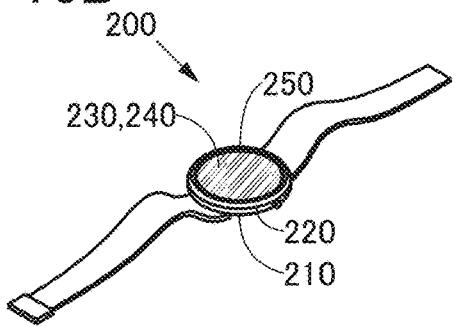
Figure 16C:
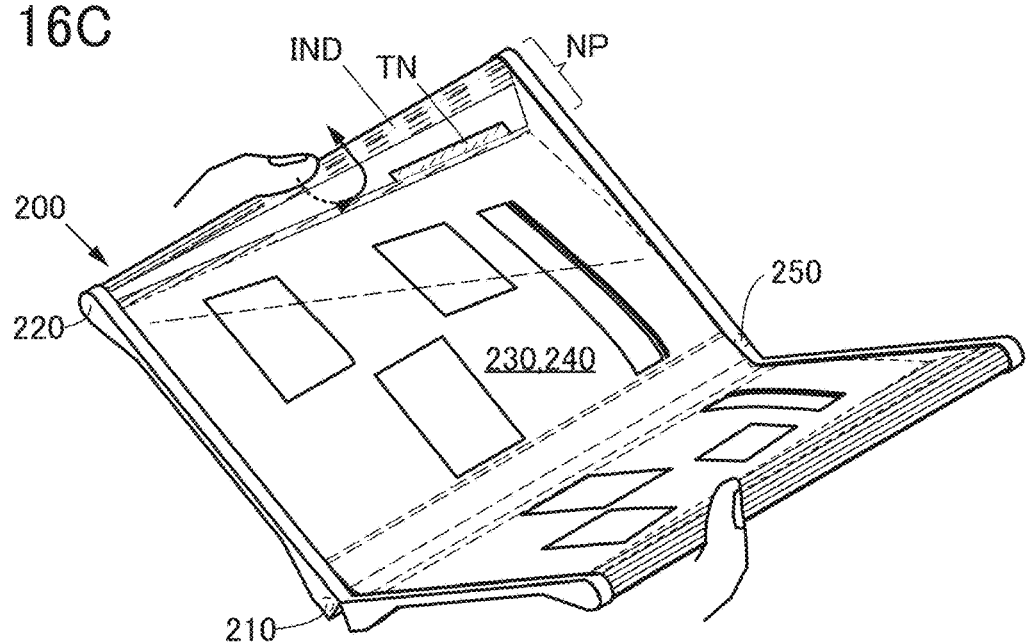

FIG. 16A is a block diagram illustrating the structure of the data processing device of one embodiment of the present invention. FIG. 16B and FIG. 16C are projection views each illustrating examples of the appearance of the data processing device.

Figure 17A:
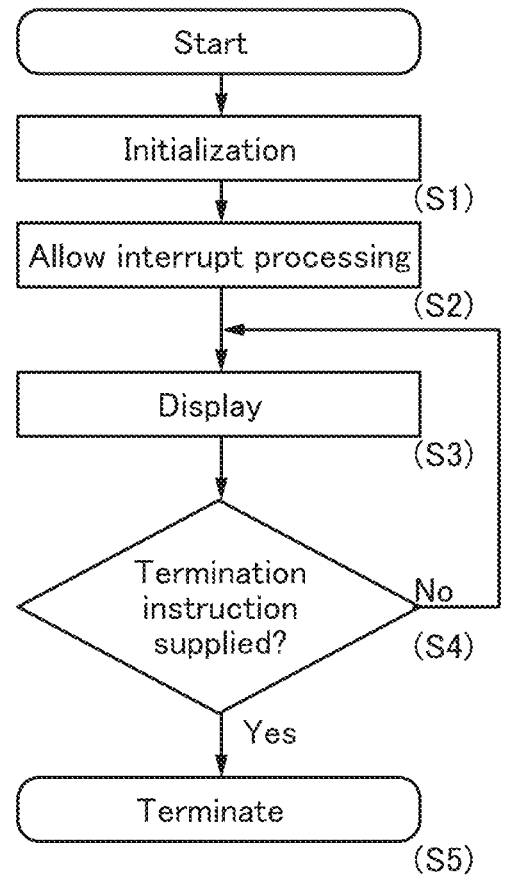
FIG. 17A and FIG. 17B are flow charts showing a driving method of a data processing device of one embodiment.
Figure 17B:
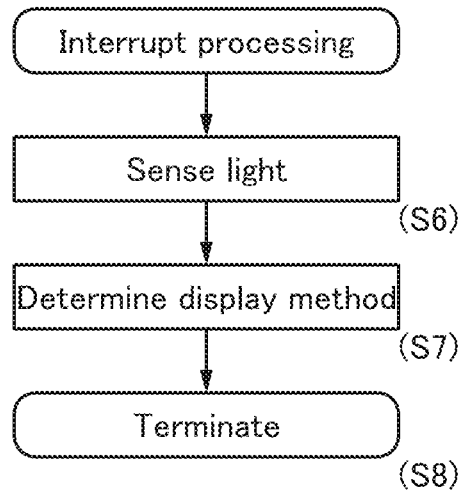

FIG. 17 shows flow charts showing a program of one embodiment of the present invention. FIG. 17A is a flow chart showing main processing of the program of one embodiment of the present invention, and FIG. 17B is a flow chart showing interrupt processing.

Figure 18A:
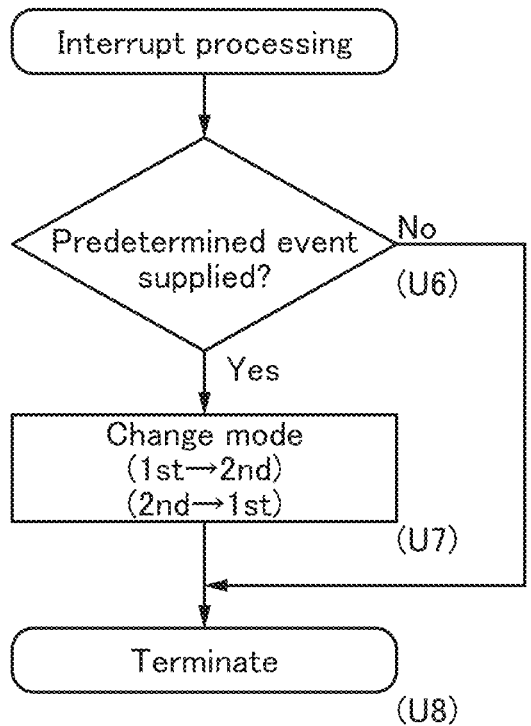
FIG. 18A to FIG. 18C are diagrams illustrating a driving method of a data processing device of one embodiment.
Figure 18B:
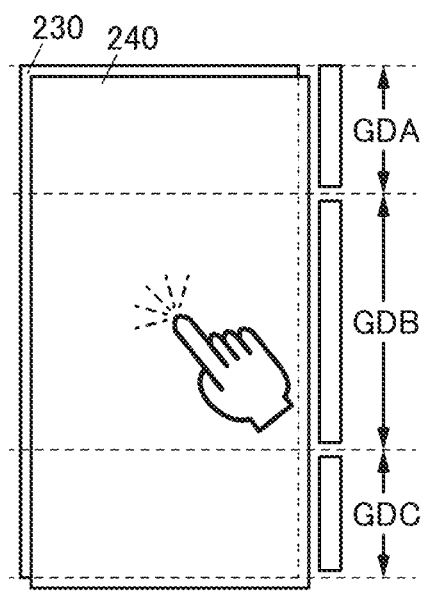
Figure 18C:
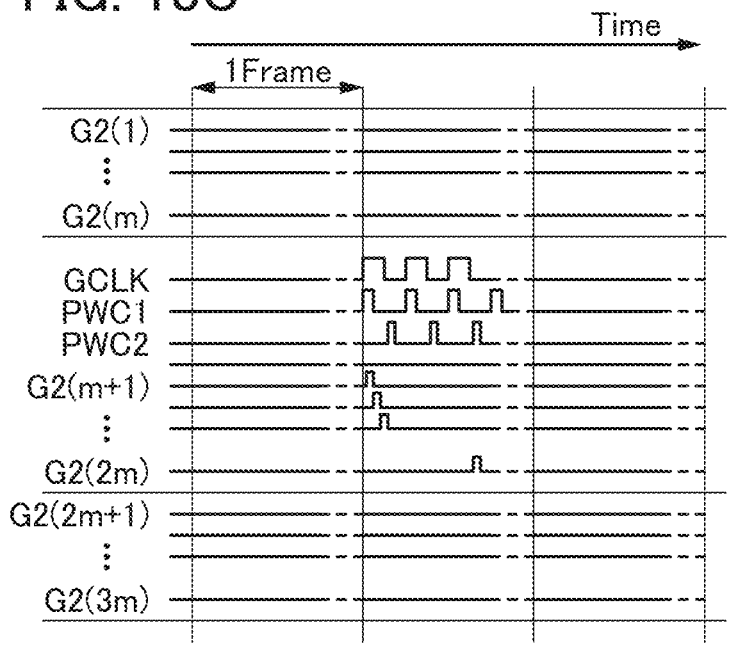

FIG. 18 shows a program of one embodiment of the present invention. FIG. 18A is a flow chart showing interrupt processing of the program of one embodiment of the present invention. FIG. 18B is a schematic view illustrating an operation of the data processing device, and FIG. 18C is a timing chart showing the operation of the data processing device of one embodiment of the present invention, which shows one frame (1Frame) and time (Time).

Structure Example 1 of Data Processing Device

The data processing device described in this embodiment includes the arithmetic unit 210 and an input/output device 220 (see FIG. 16A). Note that the input/output device 220 is electrically connected to the arithmetic unit 210. A data processing device 200 can also include a housing (see FIG. 16B and FIG. 16C).

<<Structure Example 1 of Arithmetic Unit 210>>

The arithmetic unit 210 is supplied with input data II or the sensing data DS. The arithmetic unit 210 generates the control data CI and the image data VI on the basis of the input data II or the sensing data DS and supplies the control data CI and the image data VI.

The arithmetic unit 210 includes an arithmetic portion 211 and a memory portion 212. The arithmetic unit 210 includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, or an image.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input data II and the sensing data DS. The input/output device 220 is supplied with the control data CI and the image data VI (see FIG. 16A).

As the input data II, for example, a scan code of a keyboard, positional data, operation data of buttons, sound data, or image data can be used. As the sensing data DS, for example, illuminance data, attitude data, acceleration data, bearing data, pressure data, temperature data, humidity data, or the like of an environment where the data processing device 200 is used, or the like can be used.

As the control data CI, for example, a signal controlling the luminance of display of the image data VI, a signal controlling the color saturation, or a signal controlling the hue can be used. Alternatively, a signal that changes display of part of the image data VI can be used as the control data CI.

The input/output device 220 includes the display portion 230, the input portion 240, and a sensing portion 250. For example, the input/output device described in Embodiment 6 can be used as the input/output device 220. The input/output device 220 can include a communication portion 290.

<<Structure Example of Display Portion 230>>

The display portion 230 displays the image data VI on the basis of the control data CI.

The display portion 230 includes the control portion 238, the driver circuit GD, the driver circuit SD, and the display panel 700 (see FIG. 13). For example, the display device described in Embodiment 5 can be used for the display portion 230.

<<Structure Example of Input Portion 240>>

The input portion 240 generates the input data II. For example, the input portion 240 has a function of supplying positional data P1.

For example, a human interface or the like can be used as the input portion 240 (see FIG. 16A). Specifically, a keyboard, a mouse, a touch sensor, a microphone, a camera, or the like can be used as the input portion 240.

A touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic unit 210, for example, analyzes data on the position, path, or the like of a finger in contact with the touch panel and can determine that a predetermined gesture is supplied when the analysis results meet predetermined conditions. Thus, the user can supply a predetermined operation instruction associated with a predetermined gesture in advance by using the gesture.

For instance, the user can supply a "scroll instruction" for changing the display position of image data by using a gesture of moving a finger in contact with the touch panel along the touch panel.

The user can supply a "dragging instruction" for pulling out and displaying a navigation panel NP at an edge portion of the display region 231 by using a gesture of moving a finger in contact with the edge portion of the display region 231 (see FIG. 16C). Moreover, the user can supply a "leafing through instruction" for displaying index images IND, some parts of other pages, or thumbnail images TN of other pages in a predetermined order on the navigation panel NP so that the user can flip through these images, by using a gesture of moving the position where a finger presses hard. Alternatively, the instruction can be supplied by using the finger pressing pressure. Consequently, the user can turn the pages of an e-book like flipping through the pages of a paper book. Alternatively, the user can search a certain page with the aid of the thumbnail images TN or the index images IND.

<<Structure Example of Sensing Portion 250>>

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, illuminance data, attitude data, acceleration data, bearing data, pressure data, temperature data, humidity data, or the like can be supplied.

For example, a photosensor, an attitude sensor, an acceleration sensor, a direction sensor, a GPS (Global positioning System) signal receiving circuit, a pressure-sensitive switch, a pressure sensor, a temperature sensor, a humidity sensor, a camera, or the like can be used as the sensing portion 250.

<<Communication Portion 290>>

The communication portion 290 has a function of supplying data to a network and obtaining data from the network.

<<Housing>>

Note that the housing has a function of storing the input/output device 220 or the arithmetic unit 210. Alternatively, the housing has a function of supporting the display portion 230 or the arithmetic unit 210.

Thus, the control data can be generated on the basis of the input data or the sensing data. Alternatively, the image data can be displayed on the basis of the input data or the sensing data. Alternatively, the data processing device can determine the intensity of light received by the housing of the data processing device and operate under the environment where the data processing device is used. Alternatively, a user of the data processing device can select a display method. As a result, a novel data processing device that is highly convenient, useful, or reliable can be provided.

Note that in some cases, these components cannot be clearly distinguished from each other and one component may also serve as another component or may include part of another component. For example, a touch panel in which a touch sensor overlaps with a display panel is an input portion as well as a display portion.

<<Structure Example 2 of Arithmetic Unit 210>>

The arithmetic unit 210 includes an artificial intelligence portion 213 (see FIG. 16A).

The artificial intelligence portion 213 is supplied with the input data II or the sensing data DS, and the artificial intelligence portion 213 infers the control data CI on the basis of the input data II or the sensing data DS. Moreover, the artificial intelligence portion 213 supplies the control data CI.

In this manner, the control data CI for display that can be felt suitable can be generated. Alternatively, display that can be felt suitable is possible. Alternatively, the control data CI for display that can be felt comfortable can be generated. Alternatively, display that can be felt comfortable is possible. As a result, a novel data processing device that is highly convenient, useful, or reliable can be provided.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate the control data CI for displaying extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where the input data II is shot, whether the input data is shot indoors or outdoors, whether the input data is shot in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for displaying a boundary between extracted part of the image and another part. Specifically, the artificial intelligence portion 213 can generate the control data CI for displaying a rectangle surrounding the extracted part of the image.

[Inference Using Sensing Data DS]

Specifically, the artificial intelligence portion 213 can generate an inference RI using the sensing data DS. Alternatively, the artificial intelligence portion 213 can generate the control data CI on the basis of the inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control data CI.

Structure Example 2 of Data Processing Device

Another structure of the data processing device of one embodiment of the present invention will be described with reference to FIG. 17A and FIG. 17B.

<<Program>>

A program of one embodiment of the present invention has the following steps (see FIG. 17A).

[First Step]

In a first step, settings are initialized (see (S1) in FIG. 17A).

For example, predetermined image data which is to be displayed on start-up, a predetermined mode of displaying the image data, and data for determining a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see (S2) in FIG. 17A). Note that an arithmetic unit allowed to execute the interrupt processing can perform the interrupt processing in parallel with the main processing. The arithmetic unit that has returned from the interrupt processing to the main processing can reflect the results obtained through the interrupt processing in the main processing.

The arithmetic unit may execute the interrupt processing when a counter has an initial value, and the counter may be set at a value other than the initial value when the arithmetic unit returns from the interrupt processing. Thus, the interrupt processing can always follow the start-up of the program.

[Third Step]

In a third step, image data is displayed by a predetermined mode or a predetermined display method selected in the first step or the interrupt processing (see (S3) in FIG. 17A). Note that the predetermined mode determines a mode of displaying the data, and the predetermined display method determines a method for displaying the image data. For example, the image data VI can be used as data to be displayed.

One method for displaying the image data VI can be associated with the first mode, for example. Alternatively, another method for displaying the image data VI can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, to display the image data in response to the selection signals can be associated with the first mode.

For example, when selection signals are supplied at a frequency of 30 Hz or higher, preferably 60 Hz or higher, the movement of a displayed moving image can be smooth.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, to display the image data in response to the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

In the case where a light-emitting element is used as a display element, for example, the light-emitting element can be made to emit light in a pulsed manner so that the image data is displayed. Specifically, an organic EL element can be made to emit light in a pulsed manner, and its afterglow can be used for display. The organic EL element has excellent frequency characteristics; thus, time for driving the light-emitting element can be shortened and the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied (Yes), whereas the program proceeds to the third step when the termination instruction has not been supplied (No) (see (S4) in FIG. 17A).

For example, the termination instruction supplied in the interrupt processing may be used for the determination.

[Fifth Step]

In the fifth step, the program terminates (see (S5) in FIG. 17A).

<<Interrupt Processing>>

The interrupt processing includes a sixth step to an eighth step described below (see FIG. 17B).

[Sixth Step]

In the sixth step, the illuminance of the environment where the data processing device 200 is used is sensed using the sensing portion 250, for example (see (S6) in FIG. 17B). Note that color temperature or chromaticity of ambient light may be sensed instead of the illuminance of the environment.

[Seventh Step]

In the seventh step, a display method is determined on the basis of the sensed illuminance data (see (S7) in FIG. 17B). For example, a display method is determined such that the display brightness is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see (S8) in FIG. 17B).

Structure Example 3 of Data Processing Device

Another structure of the data processing device of one embodiment of the present invention is described with reference to FIG. 18.

FIG. 18A is a flow chart showing a program of one embodiment of the present invention. FIG. 18A is a flow chart showing interrupt processing different from the interrupt processing shown in FIG. 17B.

Note that the structure example 3 of the data processing device is different from the interrupt processing described with reference to FIG. 17B in that the interrupt processing includes a step of changing a mode on the basis of a supplied predetermined event. Different portions will be described in detail here, and refer to the above description for portions that can use similar structures.

<<Interrupt Processing>>

The interrupt processing includes a sixth step to an eighth step described below (see FIG. 18A).

[Sixth Step]

In the sixth step, the program proceeds to the seventh step when a predetermined event has been supplied (Yes), whereas the program proceeds to the eighth step when the predetermined event has not been supplied (No) (see (U6) in FIG. 18A). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see (U7) in FIG. 18A). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 18B).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 18B and FIG. 18C). Specifically, the frequency of supply of the selection signal from the driver circuit GDB can be changed in accordance with a "tap" event supplied to a touch panel with a finger or the like.

A signal GCLK is a clock signal controlling an operation of the driver circuit GDB, and a signal PWC1 and a signal PWC2 are pulse width modulation signals controlling the operation of the driver circuit GDB. The driver circuit GDB supplies selection signals to a scan line G2($m$+1) to a scan line G2($2m$) in response to the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see (U8) in FIG. 18A). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 16C). Alternatively, materials distributed in a conference room in, for example, a company can be received and used for a conference material.

Note that this embodiment can be combined with other embodiments described in this specification as appropriate.

Embodiment 8

In this embodiment, the structure of the data processing device of one embodiment of the present invention will be described with reference to FIG. 19 to FIG. 21.

Figure 19A:
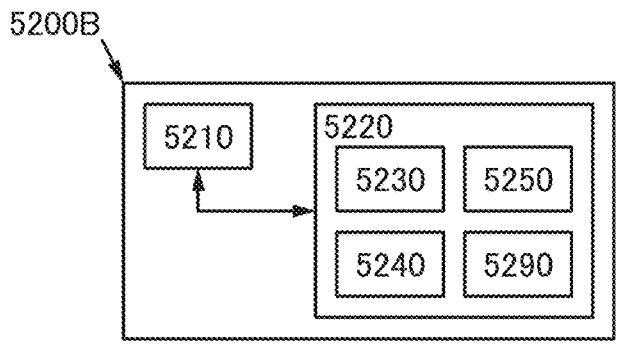
FIG. 19A to FIG. 19E are diagrams each illustrating a structure of a data processing device of one embodiment.
Figure 19B:
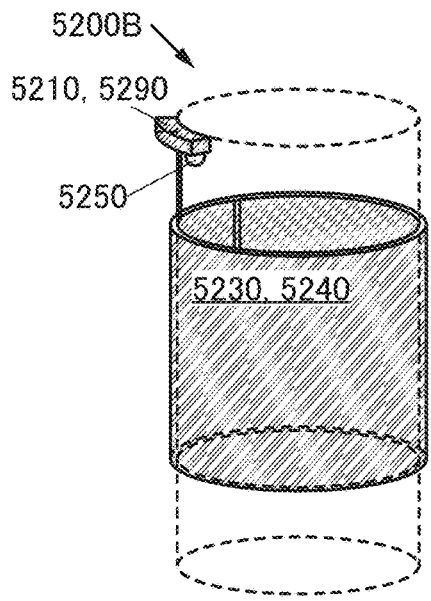
Figure 19C:
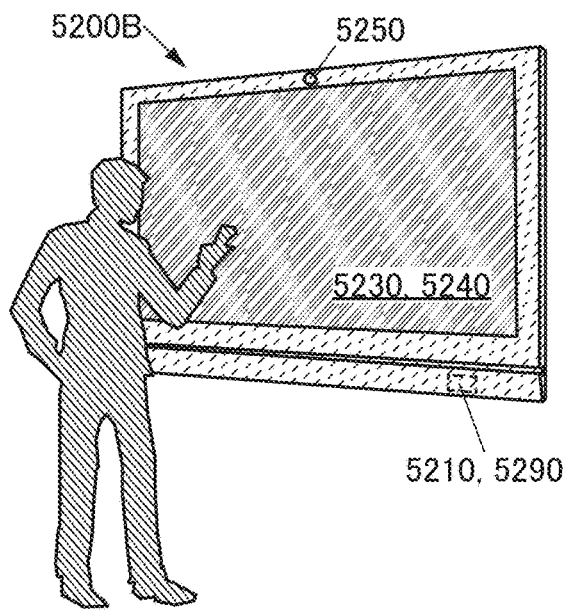
Figure 19D:
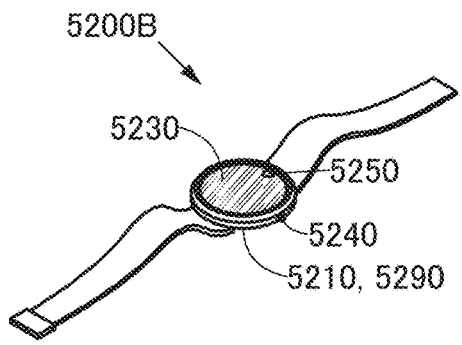
Figure 19E:
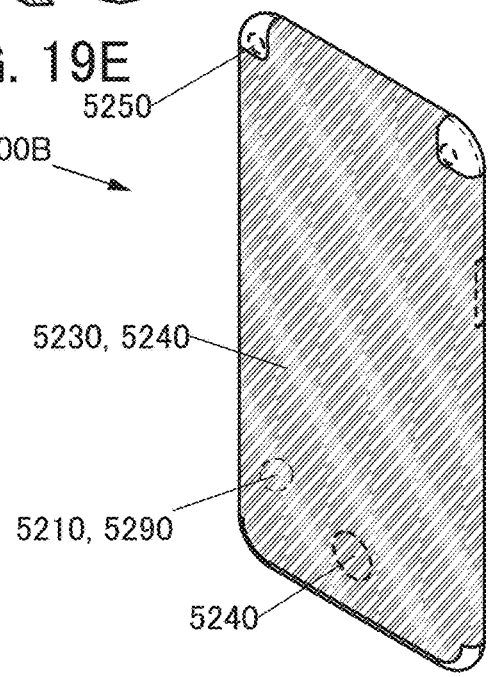
Figure 20A:
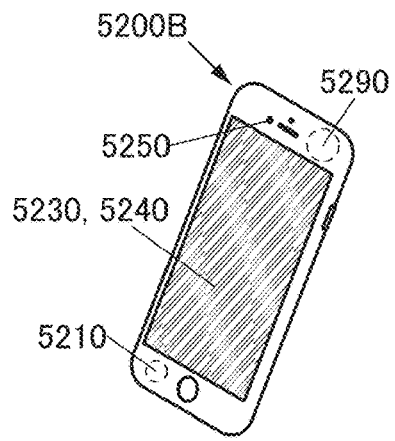
FIG. 20A to FIG. 20E are diagrams each illustrating a structure of a data processing device of one embodiment.
Figure 20B:
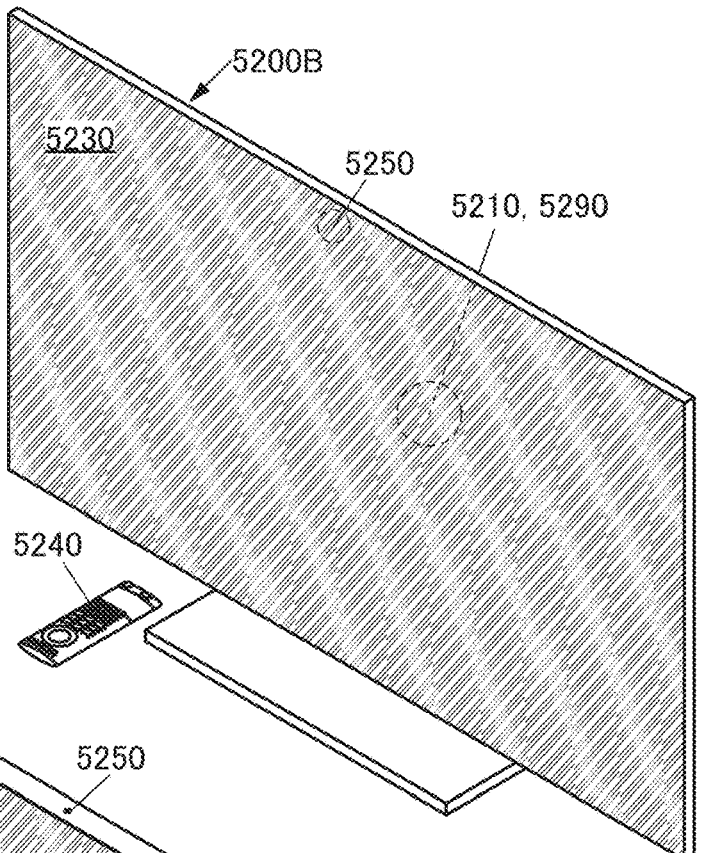
Figure 20C:
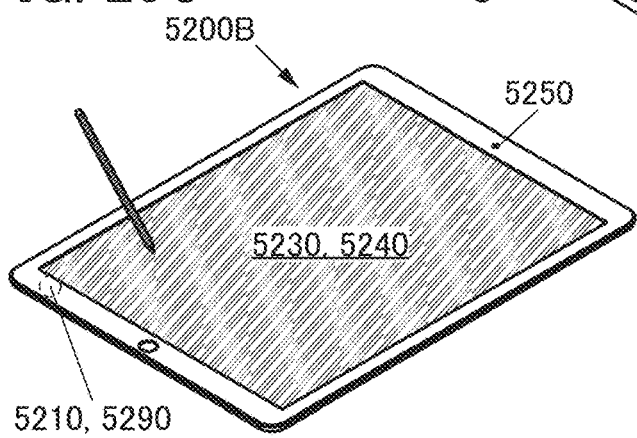
Figure 20D:
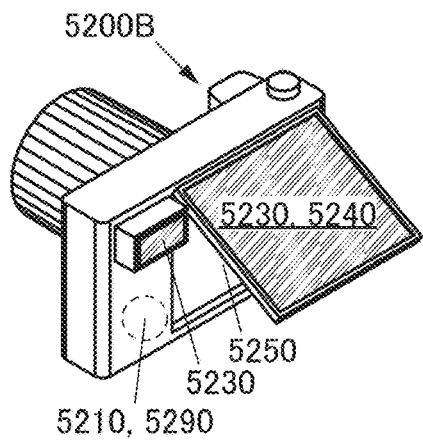
Figure 20E:
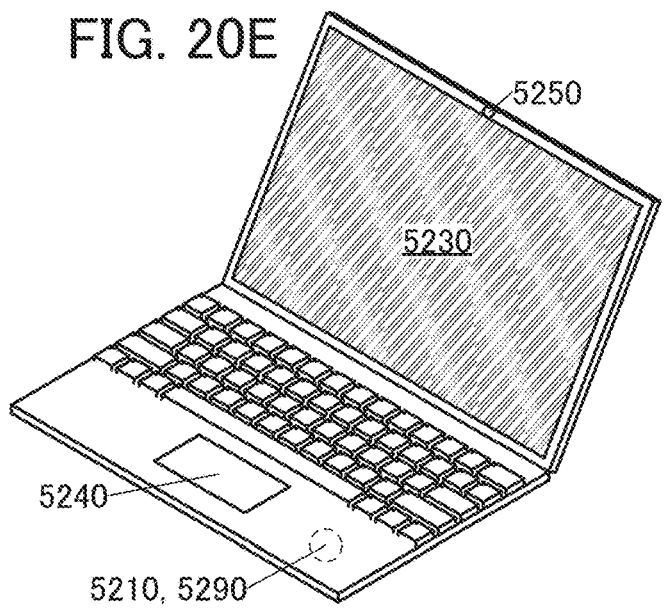
Figure 21A:
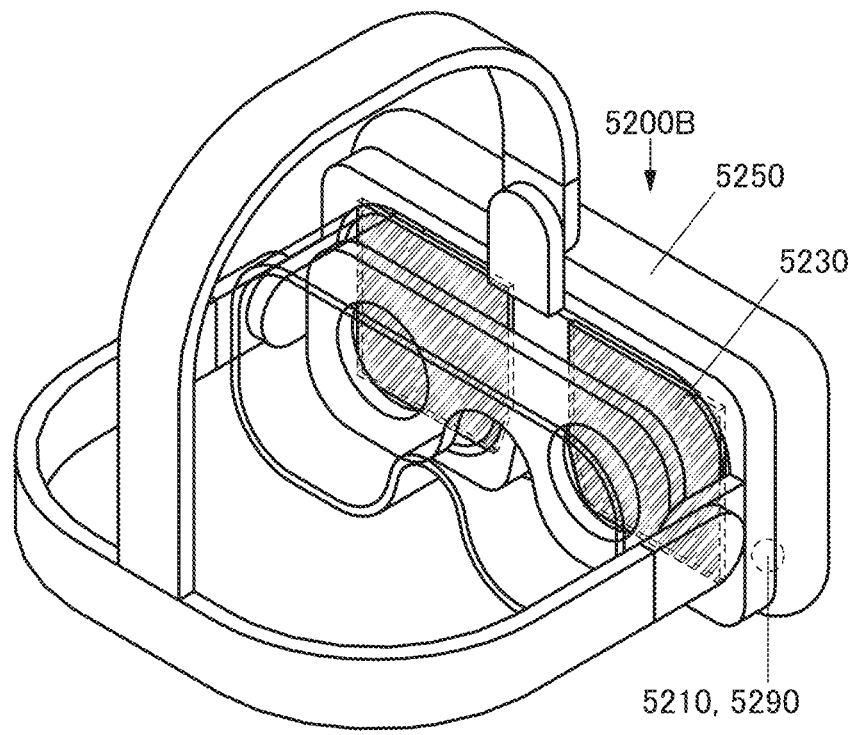
FIG. 21A and FIG. 21B are diagrams each illustrating a structure of a data processing device of one embodiment.
Figure 21B:
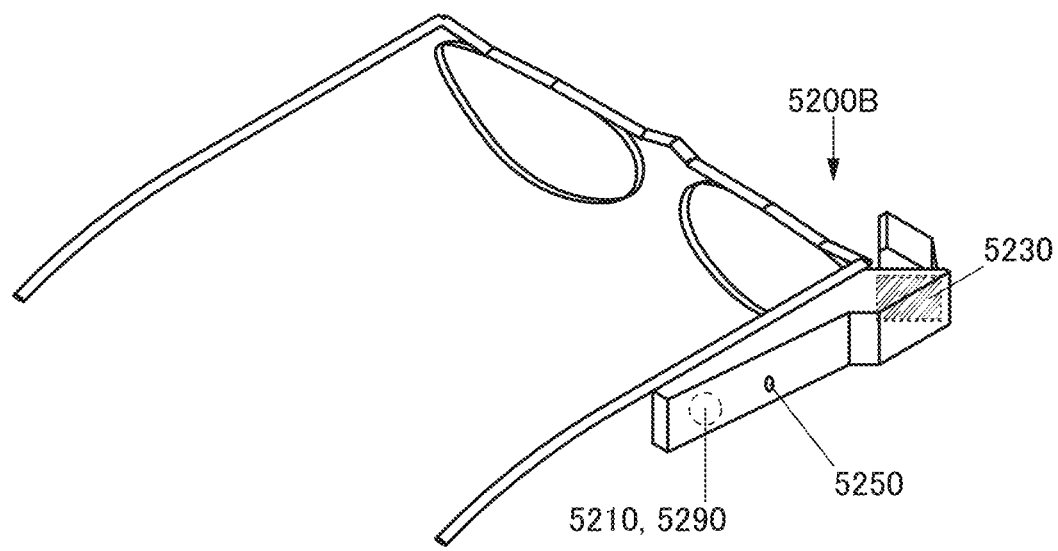

FIG. 19 to FIG. 21 are diagrams illustrating structures of the data processing device of one embodiment of the present invention. FIG. 19A is a block diagram of the data processing device, and FIG. 19B to FIG. 19E are perspective views illustrating structures of the data processing device. In addition, FIG. 20A to FIG. 20E are perspective views illustrating structures of the data processing device. In addition, FIG. 21A and FIG. 21B are perspective views illustrating structures of the data processing device.

Data Processing Device

A data processing device 5200B described in this embodiment includes an arithmetic unit 5210 and an input/output device 5220 (see FIG. 19A).

The arithmetic unit 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude detection device, or the like can be used as the input portion 5240.

The display portion 5230 includes a display panel and has a function of displaying image data. For example, the display panel described in Embodiment 3 or Embodiment 4 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude detection device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, near field communication, or the like.

<<Structure Example 1 of Data Processing Device>>

For example, the display portion 5230 can have an outer shape along a cylindrical column or the like (see FIG. 19B). In addition, the data processing device has a function of changing its display method in accordance with the illuminance of a usage environment. Furthermore, the data processing device has a function of changing displayed content in response to sensed existence of a person. This allows the data processing device to be provided on a column of a building, for example. The data processing device can display advertising, guidance, or the like. The data processing device can be used for digital signage or the like.

<<Structure Example 2 of Data Processing Device>>

For example, the data processing device has a function of generating image data on the basis of the path of a pointer used by a user (see FIG. 19C). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, digital signage, or the like.

<<Structure Example 3 of Data Processing Device>>

The data processing device can receive data from another device, and the data can be displayed on the display portion 5230 (see FIG. 19D). Several options can be displayed. The user can choose some from the options and send a reply to a transmitter of the data. For example, the data processing device has a function of changing its display method in accordance with the illuminance of a usage environment. Thus, for example, the power consumption of a smartwatch can be reduced. Alternatively, for example, a smartwatch can display an image so as to be suitably used even in an environment under strong external light, e.g., outdoors in fine weather.

<<Structure Example 4 of Data Processing Device>>

For example, the display portion 5230 has a surface gently curved along a side surface of a housing (see FIG. 19E). The display portion 5230 includes a display panel, and the display panel has a function of displaying data on the front surface, the side surfaces, the top surface, and the rear surface, for example. Thus, for example, a mobile phone can display data not only on its front surface but also on its side surfaces, its top surface, and its rear surface.

<<Structure Example 5 of Data Processing Device>>

For example, the data processing device can receive data via the Internet and display the data on the display portion 5230 (see FIG. 20A). A created message can be checked on the display portion 5230. The created message can be sent to another device. The data processing device has a function of changing its display method in accordance with the illuminance of a usage environment, for example. Thus, the power consumption of a smartphone can be reduced. Alternatively, for example, a smartphone can display an image so as to be suitably used even in an environment under strong external light, e.g., outdoors in fine weather.

<<Structure Example 6 of Data Processing Device>>

A remote controller can be used as the input portion 5240 (see FIG. 20B). For example, the data processing device can receive data from a broadcast station or via the Internet and display the data on the display portion 5230. An image of a user can be captured using the sensing portion 5250. The image of the user can be transmitted. The data processing device can acquire a viewing history of the user and provide it to a cloud service. The data processing device can acquire recommendation data from a cloud service and display the data on the display portion 5230.

A program or a moving image can be displayed on the basis of the recommendation data. For example, the data processing device has a function of changing its display method in accordance with the illuminance of a usage environment. Accordingly, for example, a television system can display an image to be suitably used even when irradiated with strong external light that enters a room in fine weather.

<<Structure Example 7 of Data Processing Device>>

For example, the data processing device can receive educational materials via the Internet and display them on the display portion 5230 (see FIG. 20C). An assignment can be input with the input portion 5240 and sent via the Internet. A corrected assignment or the evaluation of the assignment can be obtained from a cloud service and displayed on the display portion 5230. Suitable educational materials can be selected on the basis of the evaluation and displayed.

For example, the display portion 5230 can display data using an image signal received from another data processing device. When the data processing device is placed on a stand or the like, the display portion 5230 can be used as a sub-display. Thus, for example, a tablet computer can display an image to be suitably used even in an environment under strong external light, e.g., outdoors in fine weather.

<<Structure Example 8 of Data Processing Device>>

The data processing device includes, for example, a plurality of display portions 5230 (see FIG. 20D). For example, the display portion 5230 can display an image that the sensing portion 5250 is capturing. A captured image can be displayed on the sensing portion. A captured image can be decorated using the input portion 5240. A message can be attached to a captured image. A captured image can be transmitted via the Internet. The data processing device has a function of changing its shooting conditions in accordance with the illuminance of a usage environment. Accordingly, for example, a digital camera can display a subject in such a manner that an image is favorably viewed even in an environment under strong external light, e.g., outdoors in fine weather.

<<Structure Example 9 of Data Processing Device>>

For example, the data processing device of this embodiment is used as a master and another data processing device is used as a slave, whereby the other data processing device can be controlled (see FIG. 20E). As another example, part of image data can be displayed on the display portion 5230 and another part of the image data can be displayed on a display portion of another data processing device. Image signals can be supplied. With the communication portion 5290, data to be written can be obtained from an input portion of another data processing device. Thus, a large display region can be utilized by using a portable personal computer, for example.

<<Structure Example 10 of Data Processing Device>>

The data processing device includes, for example, the sensing portion 5250 that senses an acceleration or a direction (see FIG. 21A). The sensing portion 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

<<Structure Example 11 of Data Processing Device>>

The data processing device includes, for example, an imaging device and the sensing portion 5250 that senses an acceleration or a direction (see FIG. 21B). The sensing portion 5250 can supply data on the position of the user or the direction in which the user faces. The data processing device can generate image data in accordance with the position of the user or the direction in which the user faces. Accordingly, the data can be shown together with a real-world scene, for example. An augmented reality image can be displayed on a glasses-type data processing device.

Note that this embodiment can be combined with other embodiments described in this specification as appropriate.

Example

In this example, a structure and evaluation results of a fabricated display device of one embodiment of the present invention will be described with reference to FIG. 22.

Figure 22:
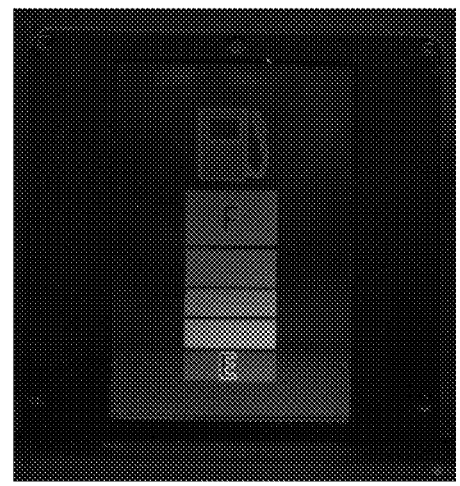
FIG. 22 is a photograph showing a display state of a display device fabricated in Example.

FIG. 22 is a diagram showing display performance of the display device of one embodiment of the present invention.

Structure of Fabricated Display Device

The display device includes a display panel and a light source.

<<Structure of Display Device>>

Table 1 shows specifications of the fabricated display device.

TABLE 1

| Panel size | 2.32 inch (portrait) |
|---|---|
| Number of effective pixels | 240 (H) × 360 (V) |
| Pixel size | 136.0 µm (H) × 136.0 µm (V) |
| Resolution | 186.8 ppi |
| Liquid crystal system | Polymer-dispersed liquid crystal |
| Coloring method | Field-sequential |
| Aperture ratio | 78.50% |
| Frame frequency | 60 Hz |
| Video signal format | Analog line sequential |
| Gate Driver | Built-in |

Display Result

An image was displayed on the fabricated display device (see FIG. 22).

Note that this example can be combined with other embodiments described in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relationship, for example, a connection relationship shown in drawings or texts, a connection relationship other than one shown in drawings or texts is regarded as being disclosed in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conduction state (on state) or a non-conduction state (off state) to control whether current flows or not. Alternatively, the switch has a function of selecting and changing a current path. Note that the case where X and Y are electrically connected includes the case where X and Y are directly connected.

An example of the case where X and Y are functionally connected is the case where one or more circuits that allow functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, the expression "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order" can be used. Alternatively, the expression "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order" can be used. When the connection order in a circuit structure is defined by an expression similar to the above examples, a source (or a first terminal or the like)

and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Alternatively, the expression "a source (or a first terminal or the like) of a transistor is electrically connected to X by at least a first electrical path through Z1, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y by at least a third electrical path through Z2, the third electrical path does not include a fourth electrical path, and the fourth electrical path is an electrical path from the drain (or the second terminal or the like) of the transistor to the source (or the first terminal or the like) of the transistor" can be used. When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, "electrical connection" in this specification includes in its category such a case where one conductive film has functions of a plurality of components.

REFERENCE NUMERALS

A: input terminal, ACF1: conductive material, AF1: alignment film, AF2: alignment film, ANO: conductive film, B: input terminal, C1: capacitor, C2: capacitor, C3: capacitor, C4: capacitor, C5: capacitor, C11: capacitor, C12: capacitor, C21: capacitor, C22: capacitor, CI: control data, CSCOM: conductive film, CP: conductive material, DS: sensing data, E: input terminal, G1: output terminal, G2: output terminal, GCLK: signal, GL1: scan line, GL2: scan line, GN1: node, GN2: node, GN3: node, GN4: node, GVDD: wiring, GVSS: wiring, II: input data, KB1: structure body, LIN: input terminal, M: transistor, M1: transistor, M3: transistor, M4: transistor, M5: transistor, M6: transistor, M7: transistor, M12: transistor, M13: transistor, M15: transistor, M16: transistor, M17: transistor, M18: transistor, M19: transistor, M20: transistor, M21: transistor, M22: transistor, M23: transistor, M24: transistor, M31: transistor, N1: node, N2: node, OUT: output terminal, P1: positional data, PWC1: signal, PWC2: signal, PWCA1: wiring, PWCA4: wiring, PWCB1: wiring, PWCB4: wiring, R: terminal, RIN: input terminal, SL1: signal line, SL2: signal line, SP: control signal, SPL: wiring, SW11: switch, SW12: switch, SW21: switch, SW22: switch, SW23: switch, SW24: switch, VO: conductive film, V11: data, VCOM1: conductive film, VEE: wiring, VI: image data, FPC1: flexible printed circuit board, 200: data processing device, 210: arithmetic unit, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 250: sensing portion, 290: communication portion, 501C: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 521B: insulating film, 524: conductive film, 530: pixel circuit, 591A: opening portion, 700: display panel, 700TP: input/output panel, 702: pixel, 705: sealant, 750: display element, 751: electrode, 752: electrode, 753: layer, 754: conductive film, 770: base material, 770P: functional film, 802: sensor, 5200B: data processing device, 5210: arithmetic unit, 5220: input/output device, 5230: display portion, 5240: input portion, 5250: sensing portion, 5290: communication portion

The invention claimed is:
1. A driver circuit comprising:
a first input terminal supplied with a first trigger signal;
a second input terminal supplied with a second trigger signal;
a third input terminal supplied with a batch selection signal;
a fourth input terminal supplied with a first pulse width modulation signal;
a fifth input terminal supplied with a second pulse width modulation signal;
a first output terminal;
a second output terminal;
a third output terminal;
a first transistor, a second transistor, a third transistor, and a fourth transistor;
a node; and
a first wiring and a second wiring,
wherein the first output terminal is configured to supply a first selection signal in response to the first pulse width modulation signal in a period from supply of the first trigger signal to supply of the second trigger signal,
wherein the first output terminal is configured to supply the first selection signal in a period during which the batch selection signal is supplied,
wherein the second output terminal is configured to supply a second selection signal in response to the second pulse width modulation signal in the period from the supply of the first trigger signal to the supply of the second trigger signal, wherein the third output terminal is configured to supply a third trigger signal, wherein the first transistor comprises a gate electrode electrically connected to the node, a first electrode electrically connected to the first output terminal, and a second electrode electrically connected to the third input terminal, wherein the second transistor comprises a gate electrode electrically connected to the node, a first electrode electrically connected to the second output terminal, and a second electrode electrically connected to the first wiring, wherein the third transistor comprises a gate electrode electrically connected to the node, a first electrode electrically connected to the third output terminal, and a second electrode electrically connected to the first wiring, and wherein the fourth transistor comprises a gate electrode electrically connected to the second wiring, a first electrode electrically connected to the node, and a second electrode electrically connected to the gate electrode of the first transistor.

2. The driver circuit according to claim 1, wherein the first transistor is in a non-conducting state in a period from supply of the first trigger signal to supply of the second trigger signal, wherein the second transistor is in a non-conducting state in the period from the supply of the first trigger signal to the supply of the second trigger signal, and wherein the third transistor is in a non-conducting state in the period from the supply of the first trigger signal to the supply of the second trigger signal.

3. A display panel comprising:

a display region and the driver circuit according to claim 1, wherein the display region comprises a first scan line, a second scan line, a first signal line, a second signal line, and a pixel, wherein the pixel comprises a display element and a pixel circuit, wherein the display element is electrically connected to the pixel circuit, wherein the pixel circuit is electrically connected to the first scan line, the second scan line, the first signal line, and the second signal line, wherein the first scan line is electrically connected to the first output terminal, and wherein the second scan line is electrically connected to the second output terminal.

4. A display device comprising the display panel according to claim 3.

5. The driver circuit according to claim 1, further comprising a capacitor, wherein a first electrode of the capacitor is electrically connected to the gate electrode of the first transistor, and wherein a second electrode of the capacitor is electrically connected to the second electrode of the first transistor.

6. A driver circuit comprising:

a first input terminal supplied with a first trigger signal;

a second input terminal supplied with a second trigger signal;

a third input terminal supplied with a batch selection signal;

a fourth input terminal supplied with a first pulse width modulation signal;

a fifth input terminal supplied with a second pulse width modulation signal;

a first output terminal;

a second output terminal;

a third output terminal;

a first transistor, a second transistor, a third transistor, and a fourth transistor;

a node; and a first wiring and a second wiring, wherein the first output terminal is configured to supply a first selection signal in response to the first pulse width modulation signal, wherein the first output terminal is configured to supply the first selection signal, wherein the second output terminal is configured to supply a second selection signal in response to the second pulse width modulation signal, wherein the third output terminal is configured to supply a third trigger signal, wherein the first transistor comprises a gate electrode electrically connected to the node, a first electrode electrically connected to the first output terminal, and a second electrode electrically connected to the third input terminal, wherein the second transistor comprises a gate electrode electrically connected to the node, a first electrode electrically connected to the second output terminal, and a second electrode electrically connected to the first wiring, wherein the third transistor comprises a gate electrode electrically connected to the node, a first electrode electrically connected to the third output terminal, and a second electrode electrically connected to the first wiring, and wherein the fourth transistor comprises a gate electrode electrically connected to the second wiring, a first electrode electrically connected to the node, and a second electrode electrically connected to the gate electrode of the first transistor.

7. The driver circuit according to claim 6, further comprising a capacitor, wherein a first electrode of the capacitor is electrically connected to the gate electrode of the first transistor, and wherein a second electrode of the capacitor is electrically connected to the second electrode of the first transistor.

8. A display panel comprising:

a display region and the driver circuit according to claim 6.

9. A display device comprising the display panel according to claim 8.

* * * * *